(12) United States Patent
Kimura

(10) Patent No.: US 9,196,652 B2
(45) Date of Patent: Nov. 24, 2015

(54) DRIVING METHOD OF A SEMICONDUCTOR DEVICE

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/318,872

(22) Filed: Jun. 30, 2014

(65) Prior Publication Data

US 2014/0374803 A1    Dec. 25, 2014

Related U.S. Application Data

(63) Continuation of application No. 14/013,280, filed on Aug. 29, 2013, now Pat. No. 8,773,416, which is a continuation of application No. 13/358,756, filed on Jan. 26, 2012, now Pat. No. 8,525,819, which is a continuation of application No. 10/200,151, filed on Jul. 23, 2002, now Pat. No. 8,106,899.

(30) Foreign Application Priority Data

Jul. 30, 2001    (JP) .................................. 2001-230540

(51) Int. Cl.
    *G09G 5/00*        (2006.01)
    *H01L 27/148*      (2006.01)
    (Continued)

(52) U.S. Cl.
    CPC .......... *H01L 27/14812* (2013.01); *H04N 5/351* (2013.01); *H04N 5/3532* (2013.01); *H04N 5/35536* (2013.01); *H04N 5/3745* (2013.01)

(58) Field of Classification Search
    CPC ........................................... G09G 3/28–3/3696
    USPC ............. 345/76–104, 204–213, 690–699, 60; 348/294–324
    See application file for complete search history.

(56) References Cited

U.S. PATENT DOCUMENTS

| 4,567,520 A | 1/1986 | Van De Polder |
| 5,247,190 A | 9/1993 | Friend et al. |

(Continued)

FOREIGN PATENT DOCUMENTS

| EP | 0665685 A | 8/1995 |
| EP | 0936680 A | 8/1999 |

(Continued)

OTHER PUBLICATIONS

Yadid-Pecht.O et al., "Wide Dynamic Range Aps Star Tracker", Solid State Sensor Arrays and CCD Cameras (Proceedings. SPIE—The International Society for Optical Engineering), 1996, vol. 2654, pp. 82-92.

(Continued)

*Primary Examiner* — Stephen Sherman
(74) *Attorney, Agent, or Firm* — Fish & Richardson P.C.

(57) ABSTRACT

A horizontal scanning period is divided into n parts (n is a natural number), so that horizontal scanning can be performed (n×y) times in one frame period. That is, n signals can be outputted from each pixel, and storage times of the n signals are different from one another. Then, since a signal suited to the intensity of light irradiated to each pixel can be selected, information of an object can be accurately read.

15 Claims, 17 Drawing Sheets

(51) Int. Cl.
*H04N 5/353* (2011.01)
*H04N 5/355* (2011.01)
*H04N 5/3745* (2011.01)
*H04N 5/351* (2011.01)

(56) References Cited

U.S. PATENT DOCUMENTS

| | | | |
|---|---|---|---|
| 5,399,502 | A | 3/1995 | Friend et al. |
| 5,615,027 | A | 3/1997 | Kuribayashi et al. |
| 5,771,070 | A | 6/1998 | Ohzu et al. |
| 5,808,677 | A | 9/1998 | Yonemoto |
| 5,990,629 | A | 11/1999 | Yamada et al. |
| 6,037,979 | A | 3/2000 | Yonemoto |
| 6,115,065 | A | 9/2000 | Yadid-Pecht et al. |
| 6,163,023 | A | 12/2000 | Watanabe |
| 6,169,317 | B1 | 1/2001 | Sawada et al. |
| 6,277,679 | B1 | 8/2001 | Ohtani |
| 6,366,321 | B1 | 4/2002 | Yonemoto |
| 6,580,094 | B1 | 6/2003 | Yamazaki |
| 6,583,775 | B1 | 6/2003 | Sekiya et al. |
| 6,605,826 | B2 | 8/2003 | Yamazaki |
| 6,611,108 | B2 | 8/2003 | Kimura |
| 6,617,644 | B1 | 9/2003 | Yamazaki |
| 6,690,033 | B2 | 2/2004 | Yamazaki |
| 6,747,699 | B2 | 6/2004 | Ohzu et al. |
| 6,750,835 | B2 | 6/2004 | Azami |
| 6,859,231 | B1 | 2/2005 | Sumi et al. |
| 6,894,431 | B2 | 5/2005 | Yamazaki |
| 6,906,751 | B1 | 6/2005 | Norita et al. |
| 6,909,114 | B1 | 6/2005 | Yamazaki |
| 6,930,722 | B1 | 8/2005 | Nakamura et al. |
| 7,022,556 | B1 | 4/2006 | Adachi |
| 7,057,655 | B1 | 6/2006 | Masuyama |
| 7,190,398 | B1 | 3/2007 | Yadid-Pecht et al. |
| 7,342,269 | B1 | 3/2008 | Yuzurihara |
| 7,402,467 | B1 | 7/2008 | Kadono |
| 7,430,025 | B2 | 9/2008 | Okamoto |
| 7,466,358 | B1 | 12/2008 | Kusaka et al. |
| 7,473,928 | B1 | 1/2009 | Yamazaki |
| 7,476,560 | B2 | 1/2009 | Yuzurihara |
| 7,623,170 | B2 | 11/2009 | Nakamura et al. |
| 2001/0002703 | A1* | 6/2001 | Koyama ............ 257/40 |
| 2001/0022565 | A1 | 9/2001 | Kimura |
| 2004/0169767 | A1 | 9/2004 | Norita et al. |

FOREIGN PATENT DOCUMENTS

| | | |
|---|---|---|
| EP | 1075028 A | 2/2001 |
| EP | 2270861 A | 1/2011 |
| EP | 2325887 A | 5/2011 |
| JP | 59-181786 A | 10/1984 |
| JP | 63-268377 A | 11/1988 |
| JP | 64-039176 A | 2/1989 |
| JP | 02-050584 A | 2/1990 |
| JP | 05-136384 | 6/1993 |
| JP | 05-145857 A | 6/1993 |
| JP | 07-038815 A | 2/1995 |
| JP | 07-255013 A | 10/1995 |
| JP | 08-181821 A | 7/1996 |
| JP | 10-092576 A | 4/1998 |
| JP | 10-239665 A | 9/1998 |
| JP | 11-176521 A | 7/1999 |
| JP | 11-297975 A | 10/1999 |
| JP | 11-307752 A | 11/1999 |
| JP | 11-331709 A | 11/1999 |
| JP | 2000-023044 A | 1/2000 |
| JP | 2000-050174 A | 2/2000 |
| JP | 2000-092396 A | 3/2000 |
| JP | 2000-278594 A | 10/2000 |
| JP | 2000-516774 | 12/2000 |
| JP | 2001-045375 A | 2/2001 |
| JP | 2001-102558 A | 4/2001 |
| JP | 2001-111020 A | 4/2001 |
| JP | 2001-111022 A | 4/2001 |
| JP | 2001-148807 A | 5/2001 |
| JP | 2001-197367 A | 7/2001 |
| WO | WO-90/13148 | 11/1990 |
| WO | WO-97/17800 | 5/1997 |
| WO | WO-00/62529 | 10/2000 |
| WO | WO-01/39490 | 5/2001 |

OTHER PUBLICATIONS

Yang.D et al., "A 640×512 CMOS Image Sensor With Ultra Wide Dynamic Range Floating-Point Pixel-Level ADC", ISSCC 99 (Digest of Technical Paperes. IEEE International Solid-State Circuits Conference), Feb. 15, 1999, pp. 308-309.

Baldo.M et al., "Highly Efficient Phosphorescent Emission From Organic Electroluminescent Devices", Nature, Sep. 10, 1998, vol. 395, pp. 151-154.

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Han.C et al., "3.8inch Green OLED With Low Temperature Poly Si TFT", Eurodisplay '99 : The 19th International Display Research Conference, Sep. 6, 1999, pp. 27-30.

Kimura.M et al., "TFT-LEPD With Image Uniformity by Area Ratio Gray Scale", Eurodisplay '99 : The 19th International Display Research Conference, Sep. 6, 1999, pp. 71-74.

Kimura.M et al., "Low-Temperature Poly-Si TFT Driven Light-Emitting-Polymer Displays and Digital Gray Scale for Uniformity", IDW '99 : Proceedings of the 6th International Display Workshops, 1999, pp. 171-174.

Schenk.H et al., "Polymers for Light Emitting Diodes", Eurodisplay '99 : The 19th International Display Research Conference, Sep. 6, 1999, pp. 33-37.

Shimoda.T et al., "Current Status and Future of Light-Emitting Polymer Display Driven by Poly-Si TFT", SID International Symposium Digest of Technical Papers, May 18, 1999, vol. 30, pp. 372-375.

Shimoda.T et al., "High Resolution Light Emitting Polymer Display Driven by Low Temperature Polysilicon Thin Film Transistor With Integrated Driver", Asia Display '98 : Proceedings of the 18th IDRC (International Display Research Conference), 1998, pp. 217-220.

Shimoda.T et al., "Technology for Active Matrix Light Emitting Polymer Displays", IEDM 99: Technical Digest of International Electron Devices Meeting, 1999, pp. 107-110.

Tsutsui.T et al., "Electroluminescence in Organic Thin Films", Photochemical Processes in Organized Molecular Systems, 1991, pp. 437-450.

Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 15, 1999, vol. 38, No. 12B, pp. L1502-L1504.

* cited by examiner

Related Art

DRIVING METHOD OF A SEMICONDUCTOR DEVICE

CROSS-REFERENCE TO RELATED APPLICATIONS

This application is a continuation of U.S. application Ser. No. 14/013,280, filed Aug. 29, 2013, now allowed, which is a continuation of U.S. application Ser. No. 13/358,756, filed Jan. 26, 2012, now U.S. Pat. No. 8,525,819, which is a continuation of U.S. application Ser. No. 10/200,151, filed Jul. 23, 2002, now U.S. Pat. No. 8,106,899, which claims the benefit of a foreign priority application filed in Japan as Serial No. 2001-230540 on Jul. 30, 2001, both of which are incorporated by reference.

BACKGROUND OF THE INVENTION

1. Field of the Invention

The present invention relates to a driving method of a semiconductor device, and more particularly to a driving method of an active matrix type semiconductor device including transistors formed on a semiconductor substrate or an insulating surface.

2. Description of the Related Art

A semiconductor device having an image sensor function is provided with a photoelectric transducer and one or plural transistors for controlling the photoelectric transducer. As the photoelectric transducer, a PN-type photodiode is often used. The other photoelectric transducer includes a PIN-type photodiode, an avalanche diode, an npn embedded diode, a Schottky diode, a phototransistor, a photoconductor for X-rays, and a sensor for infrared rays.

The semiconductor device having the image sensor function is roughly classified into a CCD type and a CMOS type. The semiconductor device of the CMOS type is classified into a passive type in which an amplifying circuit is not mounted, and an active type in which an amplifying circuit is mounted. Since the amplifying circuit has a function to amplify an image signal of an object read by a photoelectric transducer, the influence of noise is low, and accordingly, the active type CMOS semiconductor device in which the amplifying circuit is mounted is often adopted.

In the active type CMOS semiconductor device, an input terminal of the amplifying circuit having high input impedance is connected to an output terminal of the photoelectric transducer. Thus, a region in which information of the object is read does not deteriorate, and the information of the object can be read again and again. This is generally called nondestructive readout.

A method for expanding a dynamic range (light and dark ratio) by using this nondestructive readout and by outputting signals with different storage times has been studied. As an example, as reported in "O. Yadid-Pecht et. al., Proc. SPIE, vol. 2654, pp 82-92, 1996", a method is studied in which source signal line driving circuits are singly disposed above and below a pixel portion, and signals having different storage times are outputted to each of them. Besides, as another example, as reported in "ISSCC99: p 308:A 640×512 CMOS Image Sensor with Ultra Wide Dynamic Range Floating-Point Pixel-Level ADC", a method is studied in which a storage time is changed by the power of 2, like T, 2T, 4T, ..., $(2^K) \times T$ (here, T denotes a frame period) and read out.

Incidentally, the storage time denotes a time from the initialization of a photoelectric transducer provided in a pixel to the output of a signal from the pixel. In other words, it denotes a time in which a light receiving portion of a photoelectric transducer is irradiated with light and a signal is stored, and is equivalent to a time called an exposure time.

FIG. 3 shows an example of a schematic view of a semiconductor device in which a photoelectric transducer is provided. The semiconductor device of FIG. 3 includes a pixel portion 104, and a source signal line driving circuit 101, a gate signal line driving circuit 102, and a reset signal line driving circuit 103, which are disposed at the periphery of the pixel portion 104. The source signal line driving circuit 101 includes a biasing circuit 101a, a sample hold circuit 101b, a signal output line driving circuit 101c, and a final output amplifying circuit 101d.

The pixel portion 104 includes a plurality of pixels 100 arranged in a matrix form. In the pixel portion 104, x columns (vertical)×y rows (horizontal) pixels 100 are provided in the matrix form (x and y are natural numbers).

FIG. 4 is a circuit diagram of the pixel 100 provided at an i-th row and a j-th column. Each pixel 100 corresponds to a region surrounded by one of signal output lines (S1 to Sx), one of power supply lines (VB1 to VBx), one of gate signal lines (G1 to Gy), and one of reset signal lines (R1 to Ry). Besides, each pixel 100 includes a switching transistor 112, an amplifying transistor 113, a resetting transistor 114, and a photoelectric transducer 111.

The potential of the photoelectric transducer 111 provided in each pixel 100 is changed by irradiation of light reflected from an object.

When the gate signal line (Gi) is selected in a state where the potential of the photoelectric transducer has been changed by the irradiation of light, the switching transistor 112 connected to the gate signal line (Gi) is turned on, and a signal corresponding to the potential of the photoelectric transducer 111 is outputted to the signal output line (Sj) through the switching transistor 112. Then, the signal outputted to the signal output line (Sj) is outputted to the source signal line driving circuit 101.

Here, a driving method of the semiconductor device having the foregoing structure will be described with reference to FIG. 15. In FIG. 15, the horizontal axis indicates the time. Incidentally, one frame period (F) is a period from a point when a reset signal is applied to a reset signal line R (any one of R1 to Ry) to a point when a reset signal is again applied, and a horizontal scanning period (P) is a period from a point when a signal is applied to a reset signal line R to a point when a signal is applied to a reset signal line R of a next row.

First, a reset signal line (R1) is selected by a reset signal inputted from the reset signal line driving circuit 103 to the reset signal line (R1) of the first row. Incidentally, in the present specification, that the reset signal line is selected means all the resetting transistors 114 connected to the reset signal line are turned on. That is, here, the resetting transistors 114 of all pixels (pixels of the first row) connected to the reset signal line (R1) are turned on. Then, the photoelectric transducers 111 provided in the pixels of the first row are initialized.

Then, at the same time as the termination of the selection of the reset signal line (R1), a reset signal line (R2) of a next row is selected. Next, the resetting transistors 114 of all the pixels connected to the reset signal line (R2) are turned on, and the photoelectric transducers 111 provided in the pixels of the second row are initialized.

In this way, all the reset signal lines (R1 to Ry) are selected in sequence. Then, the photoelectric transducers 111 provided in the pixels 100 connected to the selected reset signal line R is initialized.

Next, signals applied to the gate signal lines (G1 to Gy) will be described. When six horizontal scanning periods (6×P)

have passed since the reset signal was inputted to the reset signal line (R1) of the first row, the gate signal line (G1) is selected by a gate signal inputted from the gate signal line driving circuit 102 to the gate signal line (G1). Then, the switching transistors 112 connected to the gate signal line (G1) are turned on, and signals are outputted to the signal output lines (S1 to Sx) by the pixels 100 of the first row. Incidentally, a storage time (L) of the signal outputted by the pixel 100 in this case is the six horizontal scanning periods (6×P).

Next, the gate signal line (G2) of the second row is selected by a gate signal inputted from the gate signal line driving circuit 102 to the gate signal line (G2) of the second row. Then, the switching transistors 112 connected to the gate signal line (G2) are turned on, and signals are outputted to the signal output lines (S1 to Sx) by the pixels 100 of the second row. A storage time (L) of the signal outputted by the pixel 100 in this case is the six horizontal scanning periods (6×P).

In this way, all the gate signal lines (G1 to Gy) are selected in sequence. Then, the signals of the pixels 100 connected to the selected gate signal line (G1 to Gy) are outputted to the signal output lines (S1 to Sx). As is apparent from FIG. 15, when this driving method is used, the storage times (L) of the signals of the pixels 100 outputted by the pixels 100 are identical to one another, and each of them is the six horizontal scanning periods (6×P).

Subsequently, the relation among the timing of the gate signal outputted to the gate signal line (G1 to Gy), the timing of the reset signal outputted to the reset signal line (R1 to Ry), and the potential of the photoelectric transducer 111 provided in the pixel 100 at the i-th row and j-th column will be described with reference to FIG. 16.

First, the reset signal line (Ri) is selected by the reset signal inputted from the reset signal line driving circuit 103 to the reset signal line (Ri). Then, the resetting transistors 114 of all the pixels 100 (pixels 100 of the i-th row) connected to the reset signal line (Ri) are turned on. Then, the photoelectric transducers 111 included in the pixels 100 of the i-th row are initialized.

After the photoelectric transducer 111 is initialized, when the photoelectric transducer 111 is irradiated with light, an electric charge corresponding to the intensity of light is generated in the photoelectric transducer 111. Then, the electric charge charged in the photoelectric transducer 111 is gradually discharged by the reset operation, and the potential of an n-channel side terminal of the photoelectric transducer 111 becomes low.

As shown in FIG. 16, in the case where the photoelectric transducer 111 is irradiated with a bright light, since the amount of discharge is large, the potential of the n-channel side terminal of the photoelectric transducer 111 becomes low. On the other hand, in the case where the photoelectric transducer 111 is irradiated with a dim light, the amount of discharge is small, and the potential of the n-channel side terminal of the photoelectric transducer 111 does not become very low as compared with the case where the bright light is irradiated.

Then, when the six horizontal scanning periods (6×P) have passed since the reset signal was inputted to the reset signal line (Ri), the gate signal line (Gi) is selected by the gate signal inputted from the gate signal line driving circuit 102 to the gate signal line (Gi) of the i-th row. Then, the switching transistor 112 connected to the gate signal line (Gi) is turned on, and the potential of the n-channel side terminal of the photoelectric transducer 111 is read out as a signal. This signal is proportional to the intensity of the light irradiated to the photoelectric transducer 111.

Incidentally, when light is irradiated, the potential of the n-channel side terminal of the photoelectric transducer 111 becomes low, and when a very bright light is irradiated, the potential of the n-channel side terminal becomes as low as the potential of a power supply reference line 121. When the potential becomes as low as the potential of the power supply reference line 121, the potential of the n-channel side terminal becomes constant, and therefore, such a state is called a saturated state.

The photoelectric transducer 111 stores the electric charge generated by the light irradiated in the storage time. Accordingly, when the storage time varies, even if light of the same intensity is irradiated, since the total amount of electric charge generated by the light varies, the value of the signal also varies. For example, in the case where an intense light is irradiated to the photoelectric transducer 111, it is saturated in a short storage time. Even in the case where a feeble light is irradiated to the photoelectric transducer 111, if the storage time is long, it reaches the saturated state sooner or later. That is, the signal is determined by the product of the intensity of the light irradiated to the photoelectric transducer 111 and the storage time.

In FIG. 16, at the point when the gate signal is inputted, although the potential of the photoelectric transducer 111 irradiated with the dim light is slightly lower than that at the point when the reset signal is inputted, it does not yet reach the saturated state.

On the other hand, the photoelectric transducer 111 irradiated with the bright light is already in the saturated state. In this case, a signal outputted from the pixel 100 can not be accurately read. Thus, it is preferable that in the case where the signal of the pixel 100 including the photoelectric transducer 111 irradiated with the bright light is read, the storage time is a little shorter.

When the foregoing driving method of the semiconductor device is used, the storage times (L) of all the signals outputted from the pixel 100 are the six horizontal scanning periods (6×P), and in other words, all the signals outputted from the pixels 100 can be outputted only in the same storage time.

Thus, in the case where the intensity of light irradiated to the pixel 100 is high, since the potential of the photoelectric transducer 111 comes to have the saturated state, information of an object can not be accurately read. In the case where the intensity of light irradiated to the pixel 100 is low, since the change of potential of the photoelectric transducer 111 is faint, signals outputted from the pixel 100 are not very different from one another, and the information of the object can not be accurately read.

When the method reported in "O. Yadid-Pecht et. al., Proc. SPIE, vol. 2654, pp 82-92, 1996" is used, storage times of signals outputted from pixels have only two kinds. Further, since the driving circuits are singly disposed above and below the pixel portion, there is also a defect that the driving circuit portion becomes large.

In the case where the method reported in "ISSCC99: p 308:A 640×512 CMOS Image Sensor with Ultra Wide Dynamic Range Floating-Point Pixel-Level ADC" is used, storage times of signals outputted from pixels are changed like T, 2T, 4T, ..., $(2^k)\times T$. As a result, there is a defect that when k increases, a readout time becomes very long. For example, in the case of k=3 (in the case where the dynamic range is expanded by a factor of 8), it becomes necessary to take a readout time eight times as long as a normal readout time.

SUMMARY OF THE INVENTION

An object of the present invention is therefore to provide a driving method of a semiconductor device which can output a signal suited to the intensity of light irradiated to a pixel.

Another object of the invention is to provide a driving method of a semiconductor device which can output a signal suited to the intensity of light irradiated to a pixel without enlarging a driving circuit and without prolonging a readout time.

Still another object of the invention is to provide a driving method of a semiconductor device which can accurately read information of an object.

In order to achieve the above objects, the invention is devised as follows: The driving method of the semiconductor device of the invention will be described with reference to FIG. 17.

In FIG. 17, the horizontal axis indicates the time. FIG. 17 shows timing charts of signals applied to gate signal lines Ga and G(a+1) by a conventional driving method, and timing charts of signals applied to gate signal lines (Ga to G(a+2)), gate signal lines (Gb to G(b+2)), and gate signal lines (Gc to G(c+2)) by the driving method of the invention. Incidentally, a, b, and c are natural numbers, and here, it is assumed that a<b<c is established.

As shown in FIG. 17, in the conventional driving method, any one of the gate signal lines (G1 to Gy) is selected in the horizontal scanning period (P). That is, horizontal scanning is performed y times (the same number as the number of gate signal lines (G1 to Gy)) in one frame period.

On the other hand, in the driving method of the invention, any three of the gate signal lines (G1 to Gy) are selected in the horizontal scanning period (P), and vertical scanning is performed. (3×y) times in one frame period. Incidentally, if three gate signal lines (G1 to Gy) are simultaneously selected in one horizontal scanning period (P), signals outputted from three pixels among pixels connected to the same signal output line (S1 to Sx) are outputted to the same signal output line (S1 to Sx), and the signals are mixed. Thus, in the invention, the horizontal scanning period (P) is divided into three parts. The parts are respectively called a first sub-horizontal scanning period, a second sub-horizontal scanning period, and a third sub-horizontal scanning period. Then, in the respective sub-horizontal scanning periods, any one of the gate signal lines (G1 to Gy) is selected. Then, signals outputted from the pixels to the signal output line (S1 to Sx) are not mixed and three gate signal lines (G1 to Gy) at the maximum can be selected in one horizontal scanning period (P).

Incidentally, although the example in which the horizontal scanning period (P) is divided into three parts is given here, the invention is not limited to this, and the horizontal scanning period (P) can be divided into an arbitrary number of parts.

Incidentally, in the first sub-horizontal period, a signal applied to the gate signal line G (any one of G1 to Gy) from the gate signal line driving circuit is made a first sub-gate signal, and in the second sub-horizontal scanning period, a signal applied to the gate signal line G from the gate signal line driving circuit is made a second sub-gate signal. Besides, in the third sub-horizontal scanning period, a signal applied to the gate signal line G from the gate signal line driving circuit is made a third sub-gate signal.

In the driving method of the semiconductor device of the invention, as shown in FIG. 17, in the first sub-horizontal scanning period of a horizontal scanning period (P), a gate signal line (Ga) of an a-th row is selected, in the second sub-horizontal scanning period, a gate signal line (Gb) of a b-th row is selected, and in the third sub-horizontal scanning period, a gate signal line (Gc) of a c-th row is selected.

Then, in the next horizontal scanning period (P), and in the first sub-horizontal scanning period, a gate signal line (Ga) of an (a+1)-th row is selected, in the second sub-horizontal scanning period, a gate signal line (Gb) of a (b+1)-th row is selected, and in the third sub-horizontal scanning period, a gate signal line (Gc) of a (c+1)-th row is selected.

In this way, all the gate signal lines (G1 to Gy) are successively selected in the respective periods of the first sub-horizontal scanning period, the second sub-horizontal scanning period, and the third sub-horizontal scanning period. In other words, the first sub-gate signal, the second sub-gate signal, and the third sub-gate signal are applied to all the gate signal lines (G1 to Gy) in sequence. In the invention, by varying the timings when the first sub-gate signal, the second sub-gate signal, and the third sub-gate signal are applied to all the gate signal lines (G1 to Gy), plural signals having different storage times can be outputted from the pixel including the photoelectric transducer.

In the invention, the horizontal scanning period (P) is divided into n parts (n is a natural number), so that the horizontal scanning can be performed (n×y) times in one frame period. That is, in the invention, n signals can be outputted from each pixel, and the storage times of the n signals are different from one another. Thus, since it becomes possible to select a signal suited to the intensity of light irradiated to the pixel, information of an object can be accurately read.

DETAILED DESCRIPTION OF THE PREFERRED EMBODIMENTS

Embodiment 1

Figure 3:
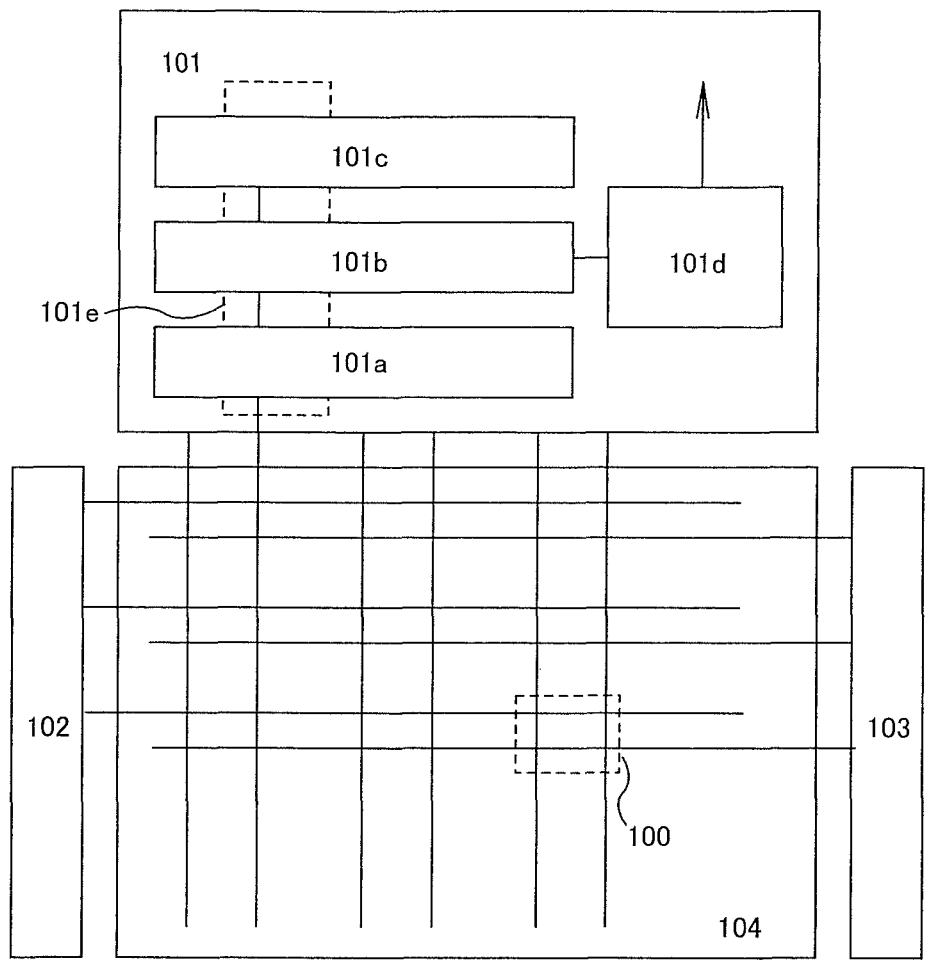
FIG. 3 is a schematic view of a semiconductor device to which the invention is applied.
Figure 4:
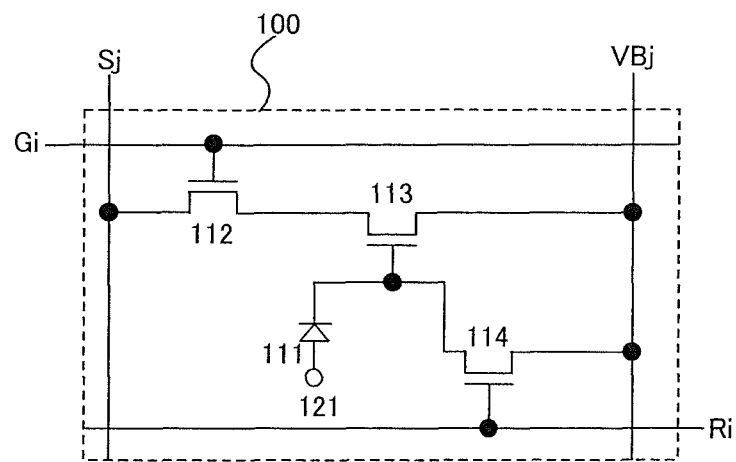
FIG. 4 is a view showing a pixel of the semiconductor device to which the invention is applied.

A driving method of the invention can be applied to any semiconductor device including a photoelectric transducer. FIGS. 3 and 4 show an example of a semiconductor device to which the invention is applied.

Incidentally, since the brief description of the structure of the semiconductor device shown in FIG. 3 and the pixel shown in FIG. 4 has been described above, it is omitted here.

In the pixel 100 shown in FIG. 4, the photoelectric transducer 111 includes an n-channel terminal, a p-channel terminal, and a photoelectric conversion layer provided between the n-channel terminal and the p-channel terminal. One of the p-channel terminal and the n-channel terminal is connected to the power supply reference line 121, and the other is connected to a gate electrode of the amplifying transistor 113.

A gate electrode of the switching transistor 112 is connected to the gate signal line (Gi). One of a source region and a drain region of the switching transistor 112 is connected to a source region of the amplifying transistor 113, and the other is connected to the signal output line (Sj). The switching transistor 112 is a transistor functioning as a switching element when a signal of the photoelectric transducer 111 is outputted.

A drain region of the amplifying transistor 113 is connected to the power supply line (VBj). A source region of the amplifying transistor 113 is connected to the source region or the drain region of the switching transistor 112. The amplifying transistor 113 is combined with a biasing transistor (not shown) provided at a lower part of the pixel portion 104 to form a source follower circuit. Thus, it is preferable that the polarity of the amplifying transistor 113 is identical to that of the biasing transistor.

A gate electrode of the resetting transistor 114 is connected to the reset signal line (Ri). One of a source region and a drain region of the resetting transistor 114 is connected to the power supply line (VBj), and the other is connected to the photoelectric transducer 111 and the gate electrode of the amplifying transistor 113. The resetting transistor 114 is a transistor functioning as an element (switching element) for initializing (resetting) the photoelectric transducer 111.

Incidentally, the structure of the pixel 100 shown in FIG. 4 is merely an example, and the invention is not limited to this. For example, one transistor (transferring transistor) may be added to the pixel 100 shown in FIG. 4, and the invention can be applied to a semiconductor device having such structure. Besides, as the photoelectric transducer 111, a photodiode or a photo gate may be used. That is, the pixel 100 may have any structure, and the number of transistors and capacitors included in the pixel 100, and their connection are not particularly limited. Besides, the number of driving circuits, such as the gate signal line driving circuit 102 and the reset signal line driving circuit 103, may be changed according to the structure of the pixel 100, and the number of driving circuits provided in the semiconductor device is not particularly limited.

Next, a driving method of the invention applied to the semiconductor device of the foregoing structure will be described with reference to FIGS. 1 and 2.

Figure 1:
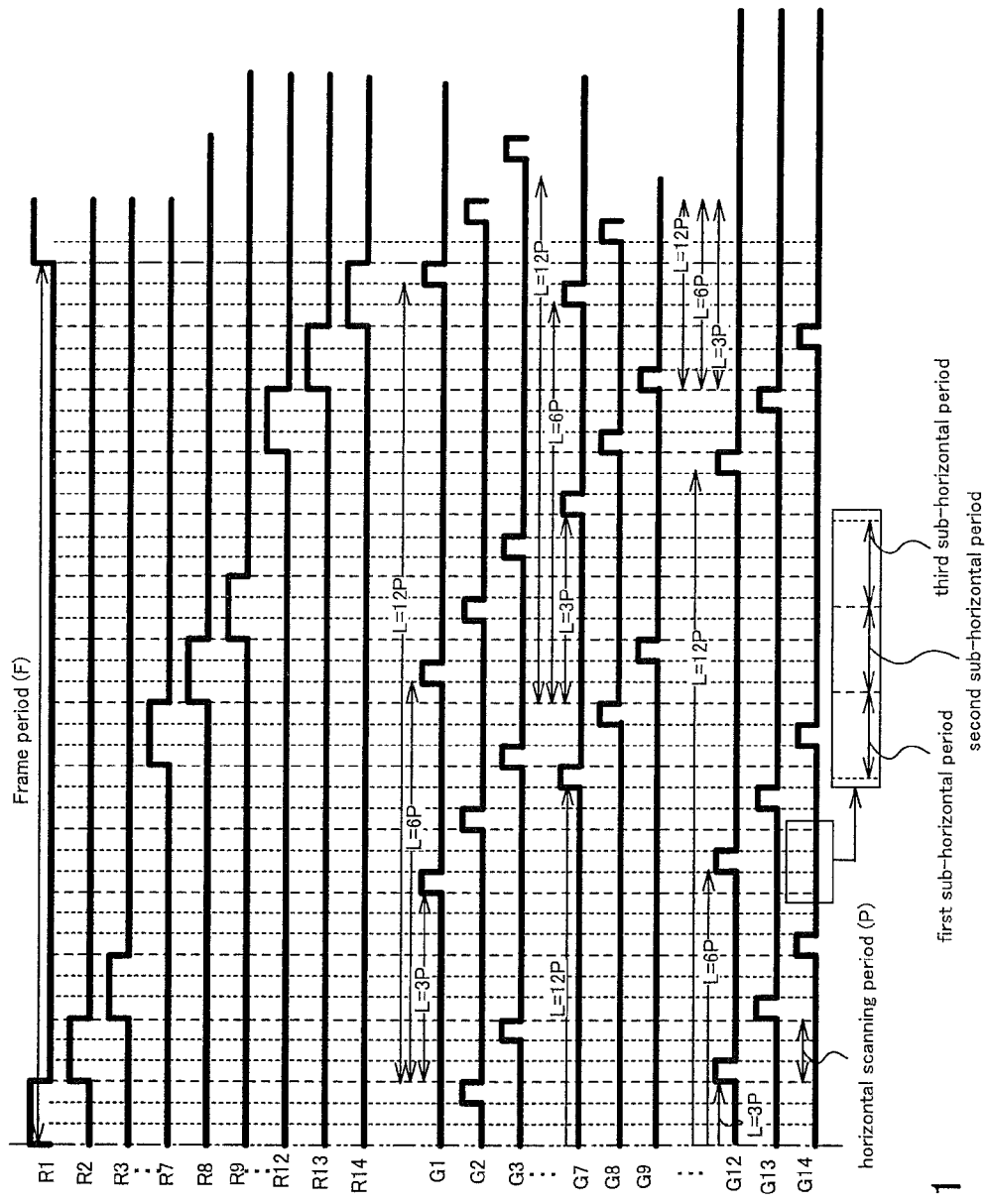
FIG. 1 is a view for explaining an operation of a semiconductor device of the invention.

In FIG. 1, the horizontal axis indicates the time, and the drawing shows timing charts of signals applied to reset signal lines (R1 to Ry) and gate signal lines (G1 to Gy). Incidentally, in this embodiment, although y is 14, the invention is not limited to this, and the number (value of y) of the reset signal lines (R1 to Ry) and the gate signal lines (G1 to Gy) can be set arbitrarily.

First, the reset signal line (R1) is selected by a reset signal inputted from the reset signal line driving circuit 103 to the reset signal line (R1) of the first row. Then, the resetting transistors 114 of all the pixels (pixels of the first row) connected to the reset signal line (R1) are turned on, and the photoelectric transducers 111 included in the pixels 100 of the first row are initialized.

At the same time as the termination of the selection of the reset signal line (R1), the reset signal line (R2) of the second row is selected. Then, the resetting transistors 114 of all the pixels 100 connected to the reset signal line (R2) are turned on, and the photoelectric transducers 111 included in the pixels 100 of the second row are initialized.

In this way, all the reset signal lines (R1 to Ry) are selected in sequence. Then, the photoelectric transducers 111 included in the pixels 100 connected to the selected reset signal line R are initialized.

Next, the timing charts of the signals applied to the gate signal lines (G1 to Gy) will be described.

When three horizontal scanning periods (3×P) have passed since the reset signal was inputted to the reset signal line (R1) of the first row, the gate signal line (G1) is selected by a first sub-gate signal inputted from the gate signal line driving circuit 102 to the gate signal line (G1) of the first row. Then, the switching transistors 112 connected to the gate signal line (G1) are turned on, and signals are outputted to the signal output lines (S1 to Sx) by the pixels 100 of the first row. Incidentally, the storage time (L) of the signal outputted by the pixel 100 in this case is the three horizontal scanning periods (3×P).

Next, the gate signal line (G12) is selected by a second sub-gate signal inputted from the gate signal line driving circuit 102 to the gate signal line (G12) of the twelfth row. Then, the switching transistors 112 connected to the gate signal line (G12) are turned on, and signals are outputted to the signal output lines (S1 to Sx) by the pixels 100 of the twelfth row.

Besides, the gate signal line (Gb) is selected by a third sub-gate signal inputted from the gate signal line driving circuit 102 to the gate signal line (Gb) (not shown) of a b-th row (b is a natural number). Then, the switching transistors 112 connected to the gate signal line (Gb) are turned on, and signals are outputted to the signal output lines (S1 to Sx) by the pixels 100 of the b-th row.

In this way, the first sub-gate signal is outputted to the gate signal line (G1) of the first row in the first sub-horizontal scanning period, the second sub-gate signal is outputted to the gate signal line (G12) of the twelfth row in the second sub-horizontal scanning period, and the third sub-gate signal is outputted to the gate signal, line (Gb) of the b-th row in the third sub-horizontal scanning period. Then, the total of the first to third sub-horizontal scanning periods becomes one horizontal scanning period (P).

Next, when four horizontal scanning periods (4×P) have passed since the reset signal was inputted to the reset signal line (R1), the gate signal line (G2) is selected by the first sub-gate signal inputted from the gate signal line driving circuit 102 to the gate signal line (G2) of the second row. Then, the switching transistors 112 connected to the gate signal line (G2) are turned on, and signals are outputted to the signal output lines (S1 to Sx) by the pixels 100 of the second row. Incidentally, the storage time (L) of the signal outputted by the pixel 100 of the second row in this case is the three horizontal scanning periods (3×P).

Next, the gate signal line (G13) is selected by the second sub-gate signal inputted from the gate signal line driving circuit 102 to the gate signal line (G13) of the thirteenth row. Then, the switching transistors 112 connected to the gate signal line (G13) are turned on, and signals are outputted to the signal output lines (S1 to Sx) by the pixels 100 of the thirteenth row.

Besides, the gate signal line (G7) is selected by the third sub-gate signal inputted from the gate signal line driving circuit 102 to the gate signal line (G7) of the seventh row. Then, the switching transistors 112 connected to the gate signal line (G7) are turned on, and signals are outputted to the signal output lines (S1 to Sx) by the pixels 100 of the seventh row.

In this way, the first sub-gate signal is outputted to the gate signal line (G2) of the second row in the first sub-horizontal scanning period, the second sub-gate signal is outputted to the gate signal line (G13) of the thirteenth row in the second sub-horizontal scanning period, and the third sub-gate signal is outputted to the gate signal line (G7) of the seventh row in the third sub-horizontal scanning period.

Subsequently, when six horizontal scanning periods (6×P) have passed since the reset signal was inputted to the reset signal line (R1), the gate signal line (G1) is selected by the second sub-gate signal inputted from the gate signal line driving circuit 102 to the gate signal line (G1). Then, the switching transistors 112 connected to the gate signal line (G1) is turned on, and signals outputted by the pixels 100 of the first row are outputted to the signal output lines (S1 to Sx). In this case, the storage time (L) of the signal outputted by the pixel 100 is the six horizontal scanning periods (6×P).

Next, the gate signal line (G9) is selected by the third sub-gate signal inputted from the gate signal line driving circuit 102 to the gate signal line (G9) of the ninth row. Then, the switching transistors 112 connected to the gate signal line (G9) are turned on, and signals are outputted to the signal output lines (S1 to Sx) by the pixels 100 of the ninth row.

Then, when twelve horizontal scanning periods (12×P) have passed since the reset signal was inputted to the reset signal line (R1), the gate signal line (G1) is selected by the third sub-gate signal inputted from the gate signal line driving circuit 102 to the gate signal line (G1). Then, the switching transistors 112 connected to the gate signal line (G1) are turned on, and signals are outputted to the signal output lines (S1 to Sx) by the pixels 100 of the first row. In this case, the storage time (L) of the signal outputted by the pixel 100 is the twelve horizontal scanning periods (12×P).

In this way, the operation is repeated such that the first sub-gate signal is inputted to one of the gate signal lines (G1 to Gy) in the first sub-horizontal scanning period, the second sub-gate signal is inputted to one of the gate signal lines (G1 to Gy) in the second sub-horizontal scanning period, and the third sub-gate signal is inputted to one of the gate signal lines (G1 to Gy) in the third sub-horizontal scanning period. At this time, in some horizontal scanning period, the gate signal line G (any one of G1 to Gy) to which the first sub-gate signal is inputted, the gate signal line G to which the second sub-gate signal is inputted, and the gate signal line G to which the third sub-gate signal is inputted are different from one another.

In this way, all the gate signal lines (G1 to Gy) are respectively selected in the first sub-horizontal scanning period, the second sub-horizontal scanning period, and the third sub-horizontal scanning period in sequence. As a result, the first sub-gate signal, the second sub-gate signal, and the third sub-gate signal are respectively inputted to all the gate signal lines (G1 to Gy).

Then, when one frame period (F) has passed, the reset signal line (R1) is again selected by the reset signal inputted from the reset signal line driving circuit 103 to the reset signal line (R1). Then, the foregoing operation as shown in FIG. 1 is repeated.

In the invention, the period (3×P in this embodiment) from the point when the reset signal is inputted to the reset signal line (R1 to Ry) to the point when the first sub-gate signal is inputted to the gate signal line (G1 to Gy), the period (6×P in this embodiment) to the point when the second sub-gate signal is inputted, and the period (12×P in this embodiment) to the point when the third sub-gate signal is inputted, are different from one another. As a result, three signals having different storage times can be outputted from the pixel 100.

Incidentally, the first sub-gate signal is outputted only in the period of the first sub-horizontal scanning period from the gate signal line driving circuit 102, the second sub-gate signal is outputted only in the period of the second sub-horizontal scanning period, and the third sub-gate signal is outputted only in the period of the third sub-horizontal scanning period. Thus, for example, the storage time (L) of the signal outputted by the pixel 100 after the six horizontal scanning periods (6×P) have passed since the reset signal was inputted to the reset signal line (R1) accurately becomes the period of the six horizontal scanning period (6×P) and one sub-horizontal scanning period. However, since the sub-horizontal scanning period is sufficiently small as compared with the storage time (L), in the present specification, the storage time (L) in the case as described above is regarded as the six horizontal scanning periods (6×P).

Besides, in this embodiment, although the horizontal scanning period (P) is equally divided into three parts, the invention is not limited to this. The horizontal scanning period (P) can be divided into an arbitrary number of parts.

Besides, in this embodiment, although the signals are outputted such that the storage time (L) is increased by the power of 2, like 3×P, 6×P, and 12×P, the invention is not limited to this. For example, the signals may be outputted so that the storage time (L) is increased by a factor of 2 every time, or signals may be outputted so that the storage time is increased by a factor of 10 every time.

In the invention, the horizontal scanning period (P) is divided into n parts (n is a natural number), so that it becomes possible to perform horizontal scanning (n×y) times in one frame period. Then, according to the invention, n signals can be outputted from each pixel, and the storage times of the n signals are different from one another. Thus, since it becomes possible to select a signal suited to the intensity of light irradiated to the pixel, information of an object can be accurately read. Besides, the dynamic range of the read object can be expanded.

Embodiment 2

In this embodiment, the relation among the timing when the first sub-gate signal, the second sub-gate signal, and the third sub-gate signal are outputted to the gate signal lines (G1 to Gy), the timing when the reset signal is outputted to the reset signal line (R1 to Ry), and the potential of the photoelectric transducer 111 will be described with reference to FIG. 2. Incidentally, in the embodiment, a description will be given on a pixel 100 provided at an i-th row and a j-th column as an example.

First, the reset signal line (Ri) is selected by the reset signal inputted from the reset signal line driving circuit 103 to the reset signal line (Ri) of the i-th row. Then, the resetting transistors 114 of all the pixels (pixels of the i-th row) connected to the reset signal line (Ri) are turned on. Then, the photoelectric transducers 111 included in the pixels of the i-th row are initialized.

Then, when three horizontal scanning periods (3×P) have passed since the reset signal was inputted to the reset signal line (Ri), the gate signal line (Gi) is selected by the first sub-gate signal inputted from the gate signal line driving circuit 102 to the gate signal line (Gi) of the i-th row. Then, the switching transistors 112 connected to the gate signal line (Gi) are turned on, and the potentials of the n-channel terminals of the photoelectric transducers 111 are read as signals. The signal is proportional to the intensity of light irradiated to the photoelectric transducer 111.

Next, when six horizontal scanning periods (6×P) have passed since the reset signal was inputted to the reset signal line (Ri), the gate signal line (Gi) is selected by the second sub-gate signal inputted from the gate signal line driving circuit 102 to the gate signal line (Gi) of the i-th row. Then, the switching transistors 112 connected to the gate signal line (Gi) are turned on, and the potentials of the n-channel terminals of the photoelectric transducers 111 are read out as signals.

Next, when twelve horizontal scanning periods (12×P) have passed since the reset signal was inputted to the reset signal line (Ri), the gate signal line (Gi) is selected by the third sub-gate signal inputted from the gate signal line driving circuit 102 to the gate signal line (Gi) of the i-th row. Then, the switching transistors 112 connected to the gate signal line (Gi) are turned on, and the potentials of the n-channel terminals of the photoelectric transducers 111 are read out as signals.

Then, when one frame period (F) has passed, the reset signal line (R(i+1)) is selected by the reset signal inputted from the reset signal line driving circuit 103 to the reset signal line (R(i+1)) of the (i+1)-th row. Then, the resetting transistors 114 are again turned on, the photoelectric transducers 111 are reset, and the foregoing operation is repeated.

As described above, according to the invention, the plural signals having the different storage times are outputted from the pixel 100 in one frame period. In FIG. 2, the potential of the photoelectric transducer 111 indicated by a solid line expresses a case where a dim light is irradiated, and the potential of the photoelectric transducer 111 indicated by a dotted line expresses a case where a bright light is irradiated.

Figure 2:
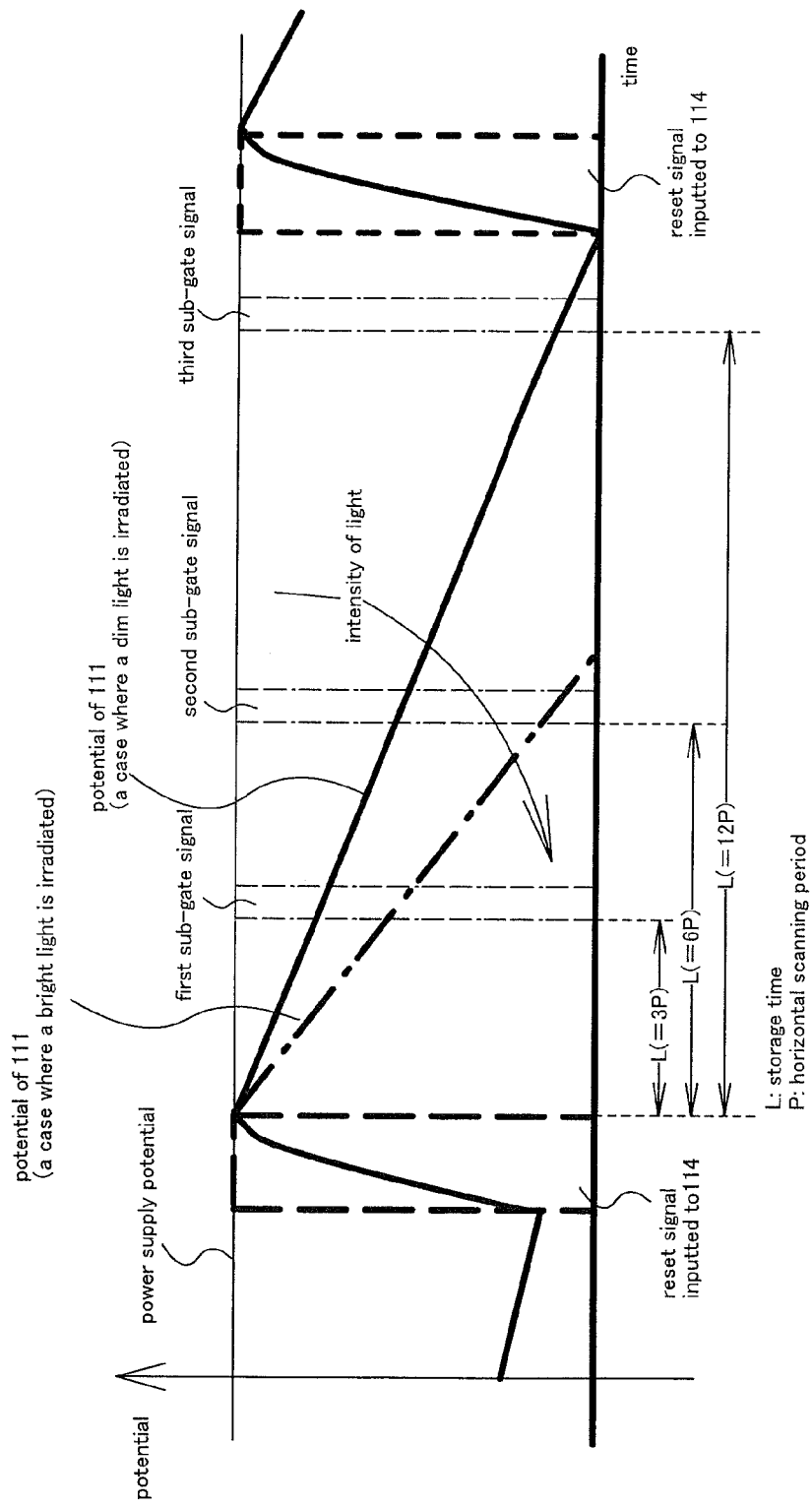
FIG. 2 is a view for explaining the relation between the potential of a photoelectric transducer and the time.

In FIG. 2, at the point of time when the first sub-gate signal is inputted, the potential of the photoelectric transducer 111 irradiated with the bright light is not very different from the potential of the photoelectric transducer 111 irradiated with the dim light.

However, at the point of time when the second sub-gate signal is inputted, the photoelectric transducer 111 irradiated with the bright light is already close to the saturated state. On the other hand, the potential of the photoelectric transducer 111 irradiated with the dim light falls short of the saturated state though it becomes slightly low as compared with the potential at the point of time when the first sub-gate signal is inputted.

At the point of time when the third sub-gate signal is inputted, the photoelectric transducer 111 irradiated with the bright light is already in the saturated state. On the other hand, the potential of the photoelectric transducer 111 irradiated with the dim light approaches the saturated state.

As set forth above, the signal outputted from the pixel 100 is determined by the product of the intensity of light irradiated to the photoelectric transducer 111 included in the pixel 100 (potential of the photoelectric transducer 111) and the storage time. That is, it is preferable that the signal of the pixel 100 including the photoelectric transducer 111 irradiated with the dim light is determined by the product of the potential of the photoelectric transducer 111 at the point of time when the third sub-gate signal is inputted and the storage time (12×P). This is because the potential does not yet reach the saturated state at the point of time when the first and the second sub-gate signals are inputted.

Besides, it is preferable that the signal of the pixel 100 including the photoelectric transducer 111 irradiated with the bright light is determined by the product of the potential of the photoelectric transducer 111 at the point of time when the second sub-gate signal is inputted and the storage time (6×P). This is because the potential does not reach the saturated state at the point of time when the first sub-gate signal is inputted, and on the other hand, it is already in the saturated state at the point of time when the third sub-gate signal is inputted.

In the invention, n (n is a natural number) signals can be outputted from each pixel, and the storage times of the n signals are different from one another. Thus, since it becomes possible to select a signal suited to the intensity of light irradiated to the pixel, information of the object can be accurately read. Besides, the dynamic range of the read object can be expanded.

Next, the invention will be described in more detail by means of examples.

Example 1

In this example, a structure and operation of a source signal line driving circuit 101 used for a semiconductor device of the invention will be described in detail with reference to FIGS. 3, 5 and 6.

In FIG. 3, the source signal line driving circuit 101 includes a biasing circuit 101a, a sample hold circuit 101b, a signal output driving circuit 101c, and a final output amplifying circuit 101d. Incidentally, the invention is not limited to this, and an analog digital signal conversion circuit or a noise reduction circuit may be provided in the source signal line driving circuit 101.

The biasing circuit 101a is paired with an amplifying transistor included in each pixel and forms a source follower circuit. The sample hold circuit 101b includes a circuit to temporarily store signals, to perform an analog digital conversion, and to reduce noise. The signal output driving circuit 101c has a function to successively output the temporarily stored signals to the final output amplifying circuit 101d. The final output amplifying circuit 101d includes a circuit to amplify the signals outputted by the sample hold circuit 101b and by the signal output driving circuit 101c. Incidentally, the final output amplifying circuit 101d may not be provided in a case where it is not necessary to amplify the signals.

Here, a detailed structure of a j-th column peripheral portion 101e of the biasing circuit 101a, the sample hold circuit 101b, and the signal output driving circuit 101c will be described with reference to FIG. 5. Incidentally, in the circuit diagram shown in FIG. 5, all transistors are n-channel transistors, however, the invention is not limited to this, and the transistor may be of an n-channel type and a p-channel type.

Figure 5:
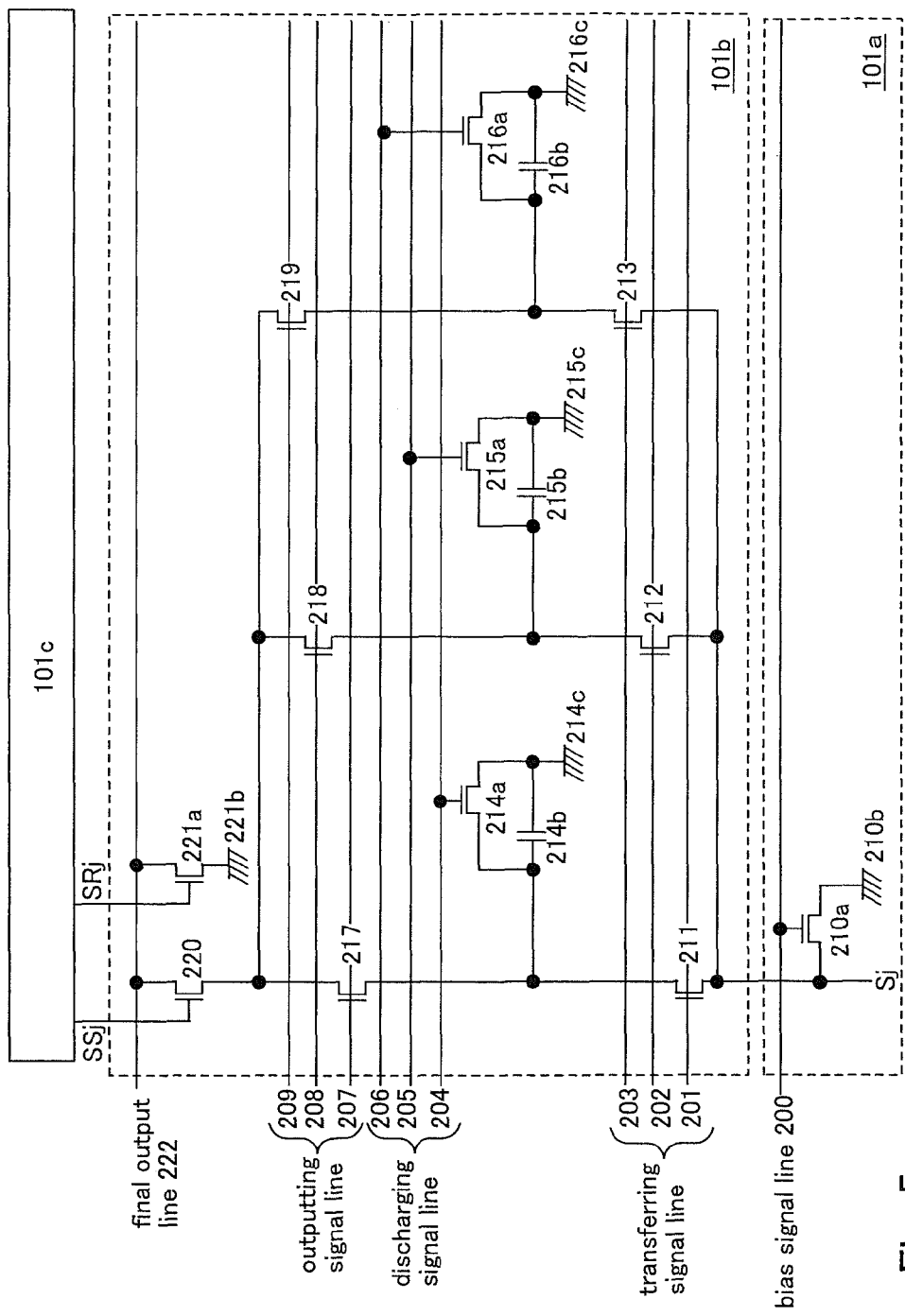
FIG. 5 is a view for explaining a source signal line driving circuit of a semiconductor device to which the invention is applied.

In FIG. 5, the biasing circuit 101a includes a biasing transistor 210a. The biasing transistor 210a has the same polarity as the amplifying transistor of each pixel, and forms a source follower circuit. A gate electrode of the biasing transistor 210*a* is connected to a bias signal line 200. One of a source region and a drain region of the biasing transistor 210*a* is connected to a signal output line (Sj), and the other is connected to a power supply reference line 210*b*. Incidentally, in this example, although the case is shown in which the n-channel transistor is used for the biasing transistor 210*a*, the invention is not limited to this. For example, p-channel transistors can also be used for the biasing transistor 210*a* and the amplifying transistor. However, in that case, the biasing transistor 210*a* is connected to a power supply line, not the power supply reference line.

The sample hold circuit 101*b* includes transferring transistors 211, 212 and 213, discharging transistors 214*a*, 215*a* and 216*a*, and outputting transistors 217, 218 and 219. Gate electrodes of the transferring transistors 211, 212 and 213 are connected to transferring signal lines 201, 202 and 203, respectively.

One of a source region and a drain region of each of the transferring transistors 211, 212 and 213 is connected to the signal line (Sj), and the other is connected to one of a source region and a drain region of each of the discharging transistors 214*a*, 215*a* and 216*a*. When the transferring transistors 211, 212 and 213 are turned on, the potential of the signal output line (Sj) is held by capacitors 214*b*, 215*b* and 216*b*.

Incidentally, in this example, although the case is shown in which the re-channel transistors are used for the transferring transistors 211, 212 and 213, the invention is not limited to this. For example, a p-channel transistor and an n-channel transistor are connected in parallel with each other, and those transistors may be used for the transferring transistor.

The capacitor 214*b* is connected to the source region and the drain region of the discharging transistor 214*a* and a power supply reference line 214*c*. A gate electrode of the discharging transistor 214*a* is connected to a discharging signal line 204.

The capacitor 215*b* is connected to the source region and the drain region of the discharging transistor 215*a* and a power supply reference line 215*c*. A gate electrode of the discharging transistor 215*a* is connected to a discharging signal line 205.

The capacitor 216*b* is connected to the source region and the drain region of the discharging transistor 216*a* and a power supply reference line 216*c*. A gate electrode of the discharging transistor 216*a* is connected to a discharging signal line 206.

Incidentally, signals outputted from the signal output line (Sj) are temporarily held in the capacitors 214*b*, 215*b* and 216*b*. Besides, the discharging transistors 214*a*, 215*a* and 216*a* are turned on, so that the electric charges of the capacitors 214*b*, 215*b* and 216*b* are discharged to the power supply reference lines 214*c*, 215*c* and 216*c* to perform initialization.

In this example, it is assumed that the signal outputted from, among the plural pixels 100 provided at the j-th row, the pixel 100 to which the first sub-gate signal is inputted is temporarily held in the capacitor 214*b*. Besides, it is assumed that the signal outputted from the pixel 100 to which the second sub-gate signal is inputted is temporarily held in the capacitor 215*b*, and the signal outputted from the pixel 100 to which the third sub-gate signal is inputted is temporarily held in the capacitor 216*b*.

Besides, the reference numerals 217, 218, and 219 designate the outputting transistors. One of a source region and a drain region of the outputting transistor 217 is connected to the capacitor 214*b*, and the other is connected to one of a source region and a drain region of a final outputting transistor 220. Besides, a gate electrode of the outputting transistor 217 is connected to an outputting signal line 207.

One of a source region and a drain region of the outputting transistor 218 is connected to the capacitor 215*b*, and the other is connected to one of the source region and the drain region of the final outputting transistor 220. Besides, a gate electrode of the outputting transistor 218 is connected to an outputting signal line 208.

One of a source region and a drain region of the outputting transistor 219 is connected to the capacitor 216*b*, and the other is connected to one of the source region and the drain region of the final outputting transistor 220. Besides, a gate electrode of the outputting transistor 219 is connected to an outputting signal line 209.

The other of the source region and the drain region of the final outputting transistor 220 is connected to a final output line 222. A gate electrode of the final outputting transistor 220 is connected to a final selection line (SSj).

Reference numeral 221*a* designates a final resetting transistor; and 221*b*, a power supply reference line. One of a source region and a drain region of the final resetting transistor 221*a* is connected to the power supply reference line 221*b*, and the other is connected to the final output line 222. Besides, a gate electrode of the final resetting transistor 221*a* is connected to a final reset line SRj. When the final resetting transistor 221*a* is turned on, the potential of the final output line 222 can be initialized to the potential of the power supply reference line 221*b*.

Next, the operation of the source signal line driving circuit 101 shown in FIG. 5 will be described with reference to FIG. 6.

Figure 6:
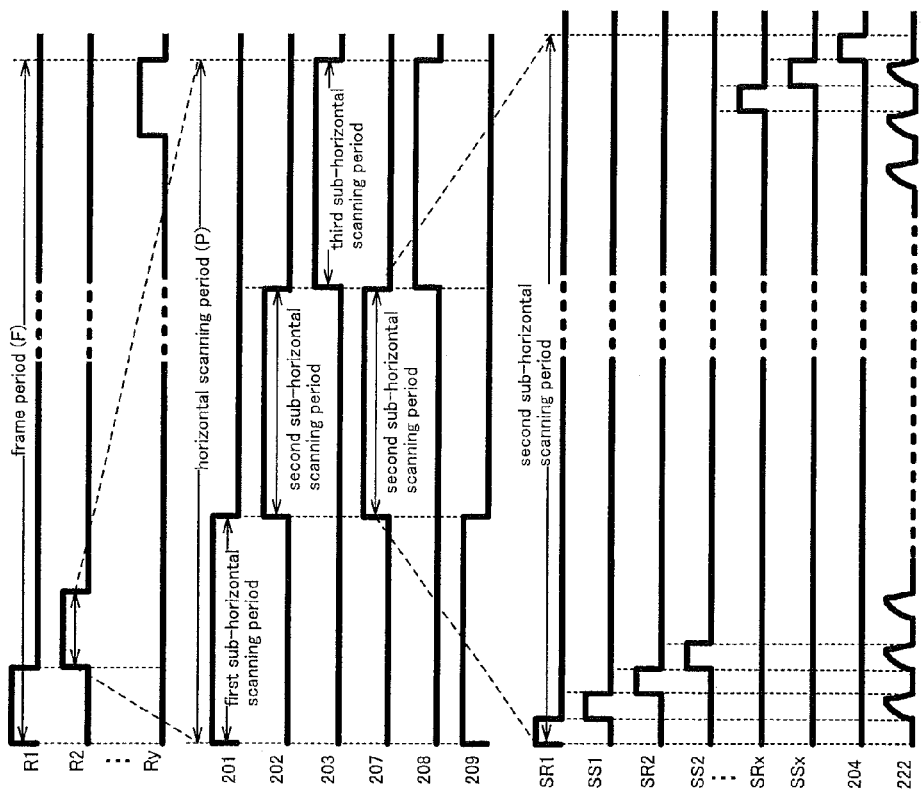
FIG. 6 is a view for explaining an operation of the source signal line driving circuit of the semiconductor device to which the invention is applied.

In the timing chart shown in FIG. 6, and in a first sub-horizontal scanning period, the transferring signal line 201 is selected, and the transferring transistor 211 connected to the transferring signal line 201 is turned on. Then, the signal outputted from the pixel 100 to which the first sub-gate signal is inputted is temporarily held in the capacitor 214*b*. Similarly, the outputting signal line 209 is selected, and the outputting transistor 219 connected to the outputting signal line 209 is turned on. Then, the signal held in the capacitor 216*b* is outputted to the final output line 222.

Next, in the second sub-horizontal scanning period, the transferring signal line 202 is selected, and the transferring transistor 212 connected to the transferring signal line 202 is turned on. Then, the signal outputted from the pixel 100 to which the second sub-gate signal is inputted is temporarily held in the capacitor 215*b*. Similarly, the outputting signal line 207 is selected, and the outputting transistor 217 connected to the outputting signal line 207 is turned on. Then, the signal held in the capacitor is outputted to the final output line 222.

Subsequently, in the third sub-horizontal scanning period, the transferring signal line 203 is selected, and the transferring transistor 213 connected to the transferring signal line 203 is turned on. Then, the signal outputted from the pixel 100 to which the third sub-gate signal is inputted is temporarily held in the capacitor 216*b*. Similarly, the outputting signal line 208 is selected, and the outputting transistor 218 connected to the outputting signal line 208 is turned on. Then, the signal held in capacitor 215*b* is outputted to the final output line 222.

Incidentally, in the respective sub-horizontal scanning periods, the final reset line (SR1 to SRx) and the final output line (SS1 to SSx) are alternately selected. In this example, the signal held in the capacitor 216*b* is outputted to the final output line 222 in the first sub-horizontal scanning period, the signal held in the capacitor 214*b* is outputted to the final output line 222 in the second sub-horizontal scanning period, and the signal held in the capacitor 215*b* is outputted to the final output line 222 in the third sub-horizontal scanning period.

Here, timing charts of signals applied to the final reset lines (SR1 to SRx) and the final output lines (SS1 to SSx) in the sub-horizontal scanning periods will be described with reference to FIG. 6. In this example, the second sub-horizontal scanning period will be exemplified.

As described above, in the second sub-horizontal scanning period, the transferring signal line 202 and the outputting signal line 207 are selected. First, the final reset line (SR1) of the first column is selected. Then, the final resetting transistor 221*a* is turned on, and the final output line 222 is initialized to some potential value. Then, the final selection line (SS1) of the first column is selected, and the final selecting transistor 220 is turned on. Then, the signal temporarily held in the capacitor 214*b* of the first column is outputted to the final output line 222.

Next, when the final reset line (SR2) of the second column is selected, the final resetting transistor 221*a* is turned on, and the final output line 222 is initialized to some potential value. Then, when the final selection line (SS2) of the second column is selected, the final selecting transistor 220 is turned on. Then, the signal temporarily held in the capacitor 214*b* of the second column is outputted to the final output line 222.

Then, the signal outputted to the final output line 222 is amplified by the final output amplifying circuit 101*d* and is outputted to the outside.

In this way, all the final reset lines (SR1 to SRx) and final output lines (SS1 to SSx) are alternately selected in sequence. Then, the signals held in the capacitors 214*b* of all the columns are outputted to the final output line 222.

Subsequently, the discharging signal line 204 is selected. Then, all the discharging transistors 214*a* connected to the discharging signal line 204 are turned on, and all the capacitors 214*b* connected to the discharging transistors 214*a* are initialized to the potential of the power supply reference line 214*c*.

Incidentally, in this example, although the case has been described in which immediately after the signal held in the capacitor 214*b* is read out, the discharging signal line 204 is selected and the capacitor 214*b* is initialized, the invention is not limited to this. The timing when the discharging signal line 204 is selected is not particularly limited, but can be arbitrarily set.

Besides, the discharging signal line 204 is selected in the case where the capacitor 214*b* is initialized, the discharging signal line 205 is selected in the case where the capacitor 215*b* is initialized, and the discharging signal line 206 is selected in the case where the capacitor 216*b* is initialized. Then, the discharging transistors 214*a*, 215*a* and 216*a* connected to the discharging signal lines 204, 205 and 206 are respectively turned on, and are initialized to the potentials of the power supply reference lines 214*c*, 215*c*, and 216*c*.

Incidentally, since the case in which the horizontal scanning period (P) is divided into three parts has been described in the embodiment, the case in which three capacitors are provided in one column has been shown in this example. However, the invention is not limited to this. The number of capacitors provided in one column can be set arbitrarily. However, in the case where one horizontal scanning period is divided into plural sub-horizontal scanning periods, signals of plural rows are outputted in one horizontal scanning period. Accordingly, it is desirable that plural (the number of sub-horizontal scanning periods) capacitors for holding the signals are provided in each column.

This example can be freely combined with the embodiments 1 and 2.

Example 2

In this example, a structure and operation of a source signal line driving circuit 101 different from the example 1 will be described in detail with reference to FIGS. 7 and 8.

First, a detailed structure of a j-th column peripheral portion 101*e* of a biasing circuit 101*a*, a sample hold circuit 101*b*, and a signal output line driving circuit 101*c* will be described with reference to FIG. 7. Incidentally, in the circuit diagram shown in FIG. 7, all transistors are n-channel transistors, however, the invention is not limited to this, and the transistor may be of an n-channel type or a p-channel type.

Figure 7:
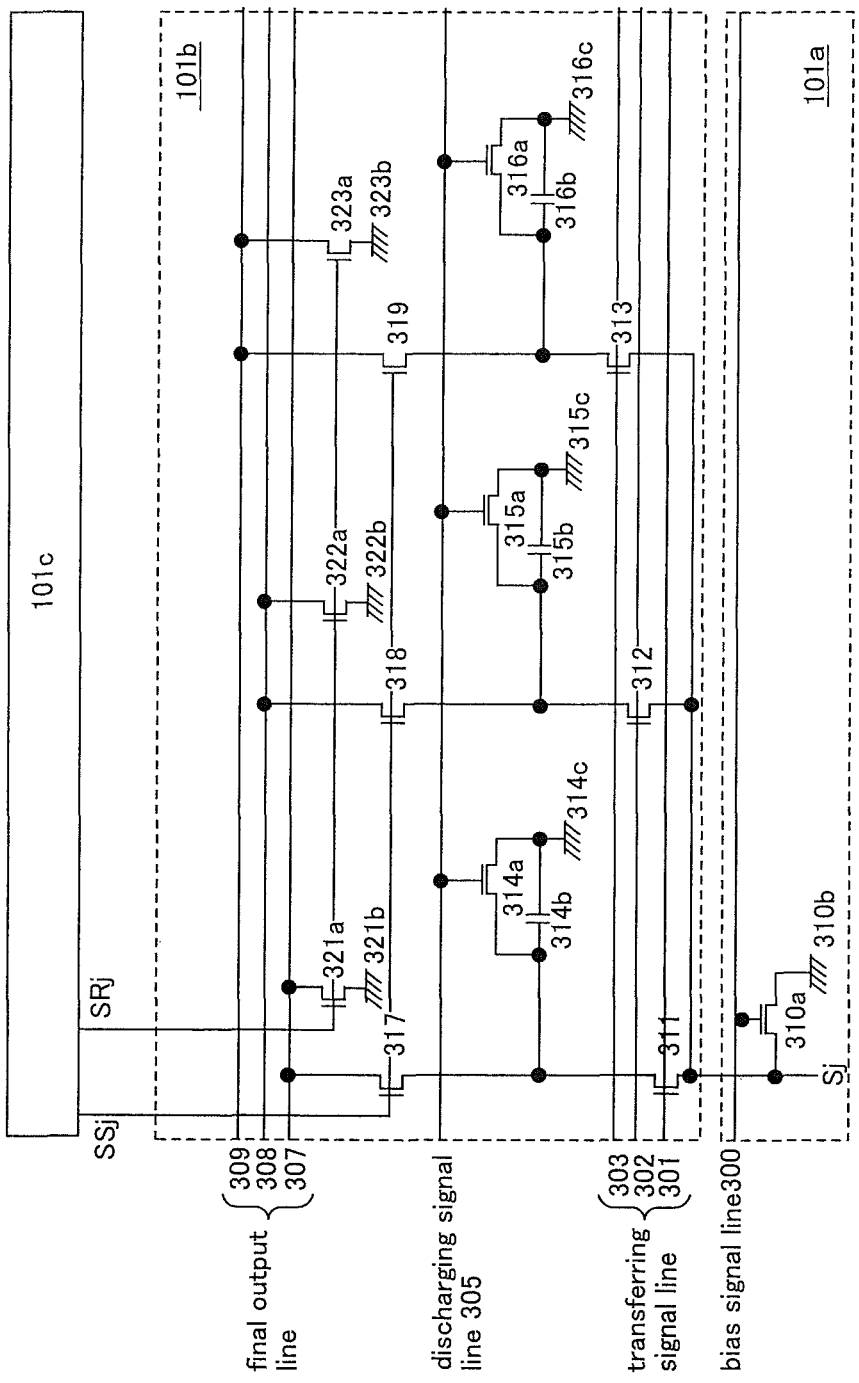
FIG. 7 is a view for explaining a source signal line driving circuit of a semiconductor device to which the invention is applied.
Figure 8:
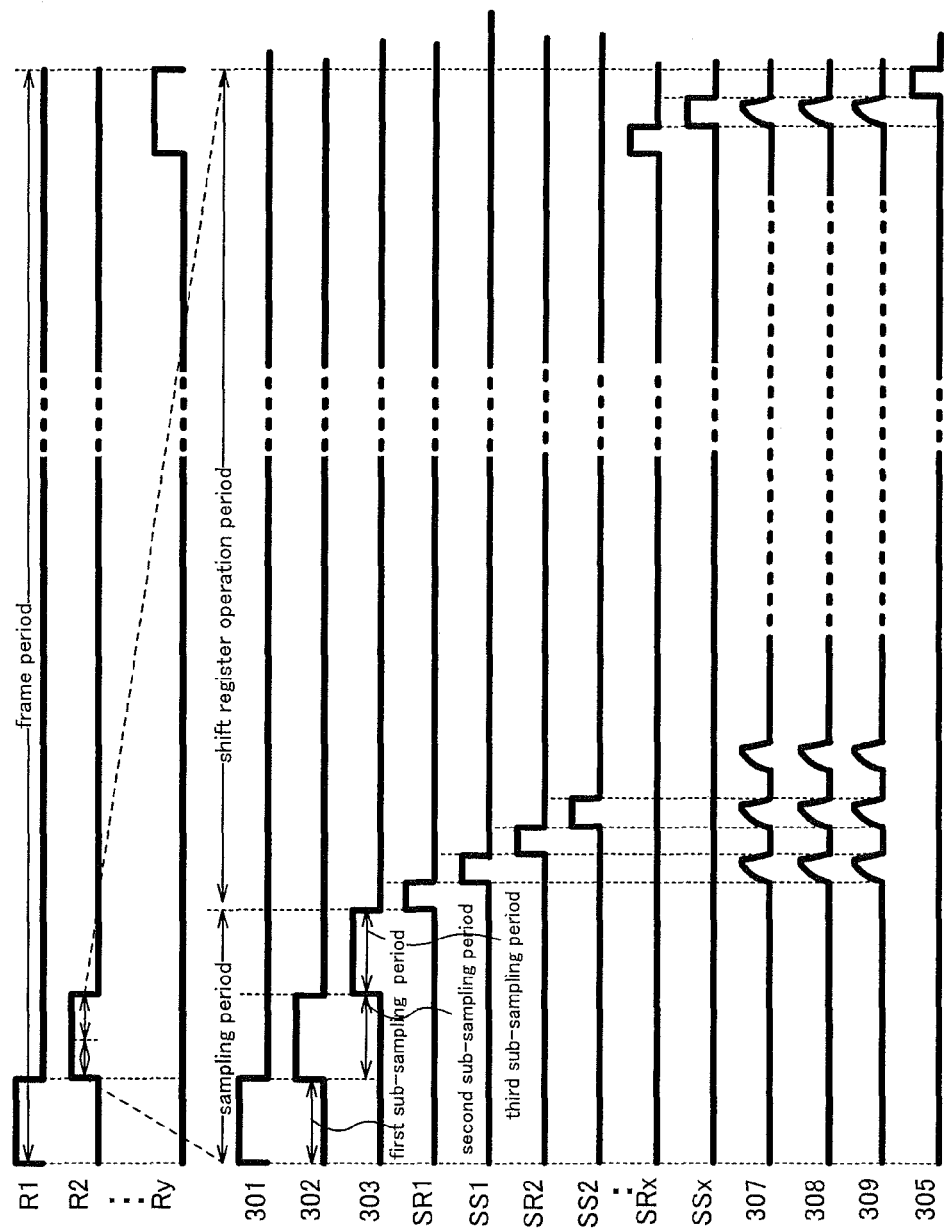
FIG. 8 is a view for explaining an operation of the source signal line driving circuit of the semiconductor device to which the invention is applied.

In FIG. 7, the biasing circuit 101*a* includes a biasing transistor 310*a*. The biasing transistor 310*a* has the same polarity as an amplifying transistor of each pixel, and forms a source follower circuit. A gate electrode of the biasing transistor 310*a* is connected to a bias signal line 300. One of a source region and a drain region of the biasing transistor 310*a* is connected to a signal output line (Sj), and the other is connected to a power supply reference line 310*b*.

Incidentally, in this example, although the case has been shown in which the n-channel transistor is used for the biasing transistor 310*a*, the invention is not limited to this. For example, p-channel transistors can also be used for the biasing transistor 310*a* and the amplifying transistor, and in that case, the biasing transistor 310*a* is connected to a power supply line, not the power supply reference line.

The sample hold circuit 101*b* includes transferring transistors 311, 312 and 313, discharging transistors 314*a*, 315*a* and 316*a*, final selecting transistors 317, 318, and 319, and final resetting transistors 321*a*, 322*a* and 323*a*.

Gate electrodes of the transferring transistors 311, 312 and 313 are connected to transferring signal lines 301, 302 and 303, respectively.

One of a source region and a drain region of each of the transferring transistors 311, 312 and 313 is connected to the signal output line (Sj), and the other is connected to one of capacitors 314*b*, 315*b* and 316*b* and one of a source region and a drain region of each of the discharging transistors 314*a*, 315*a* and 316*a*. When the transferring transistors 311, 312 and 313 are turned on, the potential of the signal output line (Sj) is transferred to the capacitors 314*b*, 315*b* and 316*b*.

Incidentally, in this example, although the case has been shown in which the n-channel transistors are used for the transferring transistors 311, 312, and 313, the invention is not limited to this. For example, a p-channel transistor and an n-channel transistor are connected in parallel with each other, and those transistors can also be used for the transferring transistor.

The capacitor 314*b* is connected to the source region and the drain region of the discharging transistor 314*a* and a power supply reference line 314*c*. A gate electrode of the discharging transistor 314*a* is connected to a discharging signal line 305.

The capacitor 315*b* is connected to the source region and the drain region of the discharging transistor 315*a* and a power supply reference line 315*c*. A gate electrode of the discharging transistor 315*a* is connected to the discharging signal line 305.

The capacitor 316*b* is connected to the source region and the drain region of the discharging transistor 316*a* and a power supply reference line 316c. A gate electrode of the discharging transistor 316a is connected to the discharging signal line 305.

Incidentally, the capacitors 314b, 315b and 316b temporarily hold signals outputted from the signal output line (Sj). The discharging transistors 314a, 315a and 316a discharge the electric charges of the capacitors 314b, 315b and 316b and initialize them to the potentials of the power supply reference lines 314c, 315c and 316c.

In this example, it is assumed that the signal outputted from the pixel 100 to which the first sub-gate signal is inputted is temporarily held in the capacitor 314b. Besides, it is assumed that the signal outputted from the pixel 100 to which the second sub-gate signal is inputted is temporarily held in the capacitor 315b, and the signal outputted from the pixel 100 to which the third sub-gate signal is inputted is temporarily held in the capacitor 316b.

The reference numerals 317, 318 and 319 designate the final selecting transistors. Gate electrodes of the final selecting transistors 317, 318 and 319 are connected to a final selection line (SSj).

One of a source region and a drain region of the final selecting transistor 317 is connected to the capacitor 314b, and the other is connected to a final output line 307. One of a source region and a drain region of the final selecting transistor 318 is connected to the capacitor 315b, and the other is connected to a final output line 308. One of a source region and a drain region of the final selecting transistor 319 is connected to the capacitor 316b, and the other is connected to a final output line 309.

The reference numerals 321a, 322a and 323a designate the final resetting transistors; and 321b, 322b and 323b, power supply reference lines. Gate electrodes of the final resetting transistors 321a, 322a and 323a are connected to a final reset line (SRj). One of a source region and a drain region of the final resetting transistor 321a is connected to the power supply reference line 321b, and the other is connected to the final output line 307.

One of a source region and a drain region of the final resetting transistor 322a is connected to the power supply reference line 322b, and the other is connected to the final output line 308. Besides, one of a source region and a drain region of the final resetting transistor 323a is connected to the power supply reference line 323b, and the other is connected to the final output line 309.

Incidentally, the final reset lines (SR1 to SRx) are provided to initialize the final output lines 307, 308 and 309. When any one of the final reset lines (SR1 to SRx) is selected and the final resetting transistors 321a, 322a and 323a are turned on, the respective potentials of the final output lines 307, 308 and 309 are initialized to the potentials of the power supply reference lines 321b, 322b and 323b.

Next, the operation of the source signal line driving circuit 101 shown in FIG. 7 will be described with reference to FIG. 8.

Incidentally, in the operation of the source signal line driving circuit 101 shown in FIG. 7, a horizontal scanning period (P) is divided into a sampling period and a shift register operation period. Then, the sampling period is divided into three parts of a first sampling period, a second sampling period, and a third sampling period.

In the first sampling period, the transferring signal line 301 is selected. When the transferring signal line 301 is selected, the transferring transistor 311 connected to the transferring signal line 301 is turned on. Then, the signal outputted from the pixel 100 to which the first sub-gate signal is inputted is temporarily held in the capacitor 314b.

Next, in the second sampling period, the transferring signal line 302 is selected, and the transferring transistor 312 connected to the transferring signal line 302 is turned on. Then, the signal outputted from the pixel 100 to which the second sub-gate signal is inputted is temporarily held in the capacitor 315b.

Subsequently, in the third sampling period, the transferring signal line 303 is selected, and the transferring transistor 313 connected to the transferring signal line 303 is turned on. Then, the signal outputted from the pixel 100 to which the third sub-gate signal is inputted is temporarily held in the capacitor 316b.

In the shift register operation period, the signals respectively held in the capacitors 314b, 315b and 316b are outputted to the final output lines 307, 308 and 309.

In the shift register operation period, first, the final reset line (SR1) of the first column is selected. When the final reset line (SR1) is selected, the final resetting transistors 321a, 322a and 323a connected to the final reset line (SR1) of the first column are turned on, and the final output lines 307, 308 and 309 are initialized to the potentials of the power supply reference lines 321b, 322b and 323b.

Next, the final selection line (SS1) of the first column is selected. When the final selection line (SS1) is selected, the final selecting transistors 317, 318 and 319 connected to the final selection line (SS1) of the first column are turned on. Then, the signals temporarily held in the capacitors 314b, 315b and 316b of the first column are outputted to the final output lines 307, 308 and 309.

Subsequently, the final reset line (SR2) of the second column is selected. When the final reset line (SR2) is selected, the final resetting transistors 321a, 322a, and 323a connected to the final reset line (SR2) of the second column are turned on, and the final output lines 307, 308 and 309 are initialized to the potentials of the power supply reference lines 321b, 322b and 323b.

Next, the final selection line (SS2) of the second column is selected. When the final selection line (SS2) is selected, the final selecting transistors 317, 318 and 319 connected to the final selection line (SS2) of the second column are turned on. Then, the signals temporarily held in the capacitors 314b, 315b and 316b of the second column are outputted to the final output lines 307, 308 and 309.

In this way, all the final reset lines (SR1 to SRx) and final output lines (SS1 to SSx) are alternately selected in sequence. Then, the signals held in the capacitors 314b, 315b and 316b of all columns are outputted to the final output lines 307, 308 and 309.

Finally, the discharging signal line 305 is selected, all the discharging transistors 314a, 315a and 316a connected to the discharging signal line 305 are turned on, and the capacitors 314b, 315b and 316b of all the columns connected to the discharging transistors 314a, 315a and 316a are initialized to the potentials of the power supply reference lines 314c, 315c and 316c.

Incidentally, the signals outputted to the final output lines 307, 308 and 309 are amplified by the final output amplifying circuit 101d, and are outputted to the outside.

Incidentally, since the case in which the horizontal scanning period (P) is divided into three parts has been given in the embodiment, the case in which the three capacitors (314b, 315b and 316b) are provided in one column has been shown in this example, however, the invention is not limited to this. The number of capacitors provided in one column can be set arbitrarily. However, in the case where one horizontal scanning period is divided into plural sub-horizontal scanning periods, signals of plural rows are outputted in one horizontal scanning period. Accordingly, it is desirable that plural (the number of sub-horizontal scanning periods) capacitors for holding signals are provided in each column.

This example can be freely combined with the embodiments 1 and 2.

Example 3

In this example, a structure and operation of a source signal line driving circuit 101 different from the examples 1 and 2 will be described in detail with reference to FIGS. 9 and 10.

First, a detailed structure of a j-th column peripheral portion 101e of a biasing circuit 101a, a sample hold circuit 101b, and a signal output line driving circuit 101c will be described with reference to FIG. 9. Incidentally, in the circuit diagram shown in FIG. 9, although all transistors are n-channel transistors, the invention is not limited to this, and the transistor may be of an n-channel type or a p-channel type.

Figure 9:
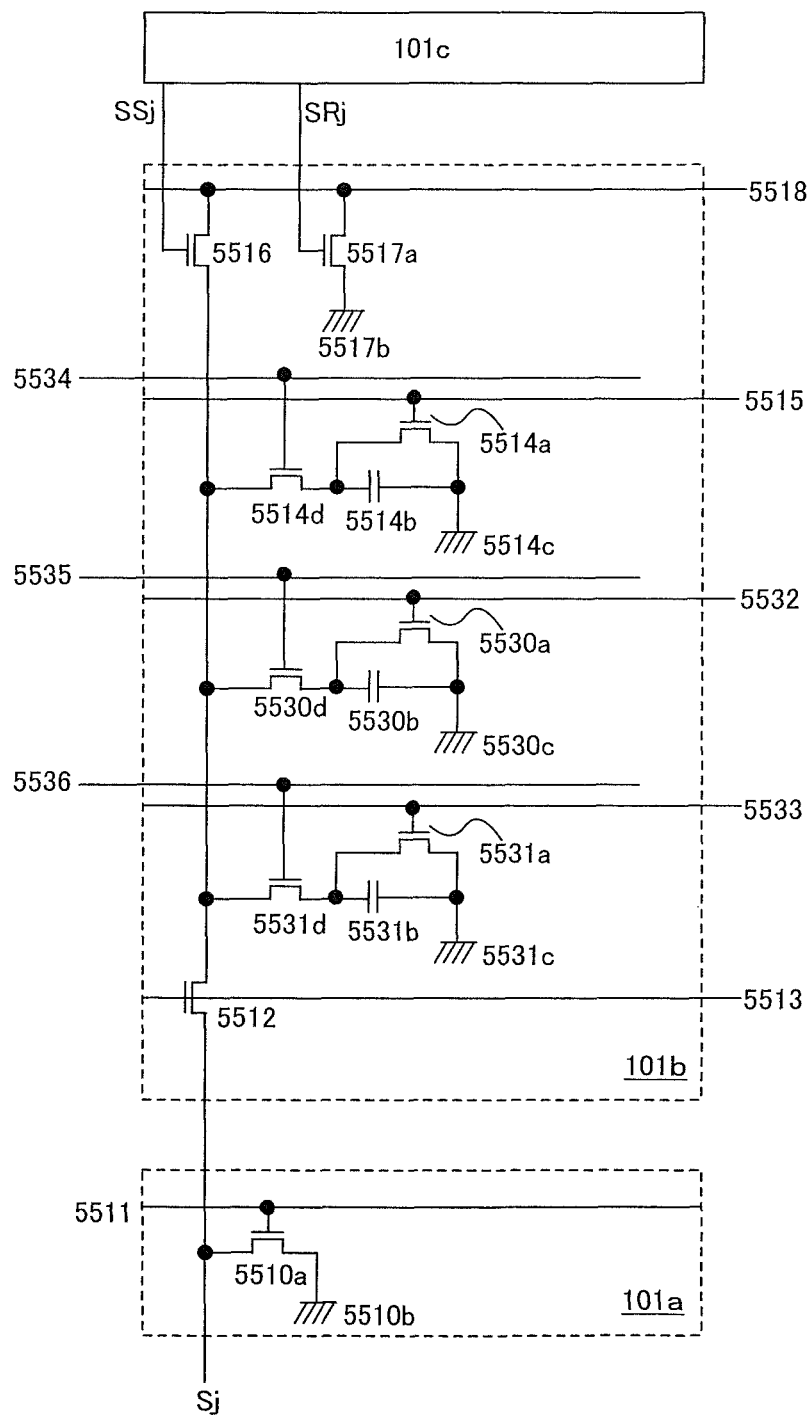
FIG. 9 is a view for explaining a source signal line driving circuit of a semiconductor device to which the invention is applied.
Figure 10:
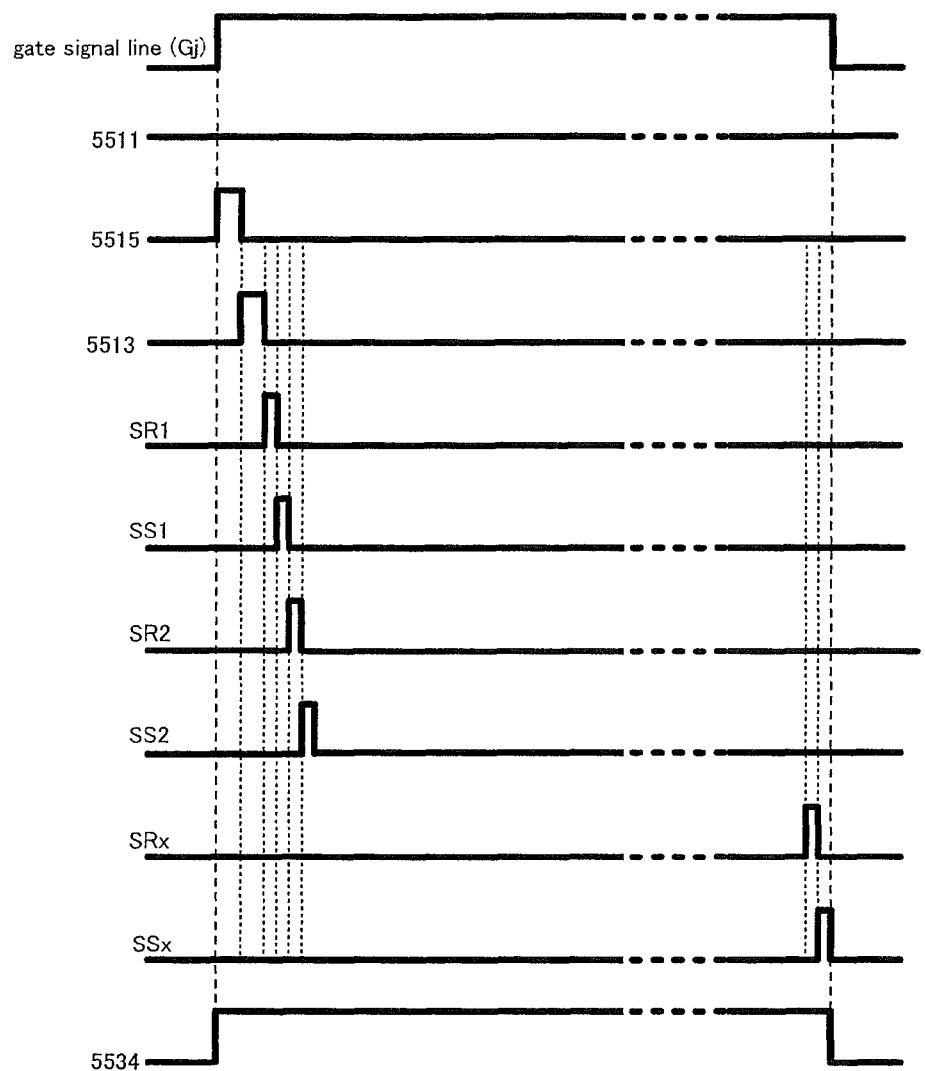
FIG. 10 is a view for explaining an operation of the source signal line driving circuit of the semiconductor device to which the invention is applied.

In FIG. 9, the biasing circuit 101a includes a biasing transistor 5510a. The biasing transistor 5510a has the same polarity as an amplifying transistor of each pixel, and forms a source follower circuit. A gate electrode of the biasing transistor 5510a is connected to a bias signal line 5511. One of a source region and a drain region of the biasing transistor 5510a is connected to a signal output line (Sj), and the other is connected to a power supply reference line 5510b.

Incidentally, in this example, although the case in which the n-channel transistor is used for the biasing transistor 5510a has been shown, the invention is not limited to this. For example, a p-channel transistor can also be used for the biasing transistor 5510a, and in that case, the biasing transistor 5510a is connected to a power supply line, not the power supply reference line.

A gate electrode of a transferring transistor 5512 is connected to a transferring signal line 5513. One of a source region and a drain region of the transferring transistor 5512 is connected to the signal output line (Sj), and the other is connected to one of a source region and a drain region of each of capacity selecting transistors 5514d, 5530d and 5531d. When the transferring transistor 5512 is turned on, the potential of the signal output line (Sj) is held in capacitors 5514b, 5530b and 5531b through the capacity selecting transistors 5514d, 5530d and 5531d.

Incidentally, in this example, although the case in which the n-channel transistor is used for the transferring transistor 5512 has been shown, the invention is not limited to this. For example, a p-channel transistor and an n-channel transistor are connected in parallel with each other and those transistors may be used for the transferring transistor.

The capacitor 5514b is connected to one of a source region and a drain region of the capacity selecting transistor 5514d and a power supply reference line 5514c. A gate electrode of the capacity selecting transistor 5514d is connected to a storage capacitor control line 5534. The other of the source region and the drain region of the capacity selecting transistor 5514d is connected to the signal output line (Sj).

Besides, a gate electrode of a discharging transistor 5514a is connected to a discharging signal line 5515. One of a source region and a drain region of the discharging transistor 5514a is connected to the capacitor 5514b, and the other is connected to the power supply reference line 5514c. The discharging transistor 5514a is turned on, so that the capacitor 5514b is initialized to the potential of the power supply reference line 5514c. Besides, the capacitor 5514b temporarily stores a signal outputted from the signal output line (Sj). In this example, among plural pixels 100 provided at the j-th column, the signal of the pixel 100 to which the first sub-gate signal is inputted is temporarily held.

The capacitor 5530b is connected to one of a source region and a drain region of the capacity selecting transistor 5530d and a power supply reference line 5530c. A gate electrode of the capacity selecting transistor 5530d is connected to a storage capacitor control line 5535. The other of the source region and the drain region of the capacity selecting transistor 5530d is connected to the signal output line (Sj).

A gate electrode of a discharging transistor 5530a is connected to a discharging signal line 5532. One of a source region and a drain region of the discharging transistor 5530a is connected to the capacitor 5530b, and the other is connected to the power supply reference line 5530c. The discharging transistor 5530a is turned on, so that the capacitor 5530b is initialized to the potential of the power supply reference line 5530c. The capacitor 5530b temporarily holds a signal outputted from the signal output line (Sj). In this example, among the plural pixels 100 provided at the j-th column, the signal of the pixel 100 to which the second sub-gate signal is inputted is temporarily held.

The capacitor 5531b is connected to one of a source region and a drain region of the capacity selecting transistor 5531d and a power supply reference line 5531c. A gate electrode of the capacity selecting transistor 5531d is connected to a storage capacitor control line 5536. The other of the source region and the drain region of the capacity selecting transistor 5531d is connected to the signal output line (Sj).

A gate electrode of a discharging transistor 5531a is connected to a discharging signal line 5533. One of a source region and a drain region of the discharging transistor 5531a is connected to the capacitor 5531b, and the other is connected to the power supply reference line 5531c. The discharging transistor 5531a is turned on, so that the capacitor 5531b is initialized to the potential of the power supply reference line 5531c. The capacitor 5531b temporarily holds a signal outputted from the signal output line (Sj). In this example, among the plural pixels 100 provided at the j-th column, the signal of the pixel 100 to which the third sub-gate signal is inputted is temporarily held.

One of a source region and a drain region of a final selecting transistor 5516 is connected to one of a source region and a drain region of each of the capacity selecting transistors 5514d, 5530d and 5531d. The other of the source region and the drain region of the final selecting transistor 5516 is connected to a final output line 5518. A gate electrode of the final selecting transistor 5516 is connected to a final selection line SSj of the j-th column.

The final selection lines (SS1 to SSx) and final reset lines (SR1 to SRx) are provided in a matrix form in the sample hold circuit 101b, and are alternately selected from the first column to the x-th column. For example, the final selection line SSj is selected, and the final selecting transistor 5516 is turned on. Then, one of the storage capacitor control lines 5534, 5535 and 5536 is selected, and one of the capacity selecting transistors 5514d, 5530d and 5531d is turned on. Then, the signal held in the one of the capacitors 5514b, 5530b and 5531b connected to the one of the capacity selecting transistors 5514d, 5530d and 5531d, which was turned on, is outputted to the final output line 5518.

Incidentally, there is a case where an electric charge has been stored in the final output line 5518 before the signal is outputted to the final output line 5518. In that case, the potential at the time when the signal is outputted to the final output line 5518 is influenced by the electric charge. Then, it is necessary that the potential of the final output line 5518 is initialized to some potential value before the signal is outputted to the final output line 5518. Thus, before the final selecting line SSj is selected, the final reset line SRj is selected, and a final resetting transistor 5517a is turned on. Then, the potential of the final output line 5518 is initialized to the potential of a power supply reference line 5517b.

Next, the operation of the source signal line driving circuit 101 shown in FIG. 9 will be described with reference to FIG. 10.

Incidentally, in this example, the operation at the time when the gate signal line (Gj) of the j-th row is selected will be exemplified. Besides, in this example, the operation in the sub-horizontal scanning period described in the example 1 will be described. Further, in this example, in the source signal line driving circuit 101 shown in FIG. 9, a description will be given of the operation at the time when the signal temporarily stored in the capacitor 5514b is outputted to the final output line 5518.

First, the gate signal line (Gj) of the j-th row is selected, and next, the discharging signal line 5515 is selected. Then, the discharging transistor 5514a is turned on. Besides, similarly to the gate signal line (Gj), the storage capacitor control line 5534 is also selected.

Next, the transferring signal line 5513 is selected, and when the transferring transistor 5512 is turned on, the signal outputted from the photoelectric transducer of each pixel is outputted to the capacitor 5514b of each column.

Then, the signals stored in the capacitors 5514b of the respective columns are outputted to the final output line 5518 in sequence. First, when the final reset line SR1 of the first column is selected, the final resetting transistor 5517a is turned on. Then, the final output line SS1 of the first column is initialized to the potential of the power supply reference line 5517b, and the final selection line SS1 of the first column is selected. Then, the final selecting transistor 5516 is turned on, and the signal of the capacitor 5514b of the first column is outputted to the final output line 5518.

Next, the final rest line SR2 of the second column is selected, the final resetting transistor 5517a is turned on, and the final output line SS2 of the second column is initialized to the potential of the power supply reference line 5517b. Then, the final selection line SS2 of the second column is selected, the final selecting transistor 5516 is made conductive, and the signal of the capacitor 5514b of the second column is outputted to the final output line 5518.

In this way, all the final reset lines (SR1 to SRx) from the first column to the x-th column are selected in sequence, and a similar operation is repeated. Then, the signals of all the columns are outputted to the final output line 5518, and the signals outputted to the final output line 5518 are amplified by the final output amplifying circuit 101d and are outputted to the outside.

Incidentally, in this example, since the case in which the horizontal scanning period (P) is divided into three parts has been shown in the embodiment, the case in which the three capacitors (5514b, 5530b, 5531b) are provided in one column has been shown in this example, however, the invention is not limited to this. The number of capacitors provided in one column can be set arbitrarily. However, in the case where one horizontal scanning period is divided into plural sub-horizontal scanning periods, signals of plural rows are outputted in one horizontal scanning period. Accordingly, it is desirable that plural (the number of sub-horizontal scanning periods) capacitors for holding the signals are provided in each column.

This example can be freely combined with the embodiments, and the examples 1 and 2.

Example 4

In this example, a detailed structure of the final output amplifying circuit 101d shown in FIG. 3 will be described with reference to FIGS. 11A and 11B. Incidentally, a signal outputted to the final output line may be extracted to the outside as it is, without amplification. However, in the case where a signal to be outputted is faint, it is preferable to amplify the signal before it is extracted to the outside. Besides, in this example, although a source follower circuit is shown as a signal amplification circuit of the simplest structure, the invention is not limited to this. A well-known amplification circuit such as an operational amplifier may be used for the final output amplifying circuit 101d.

Figure 11A:
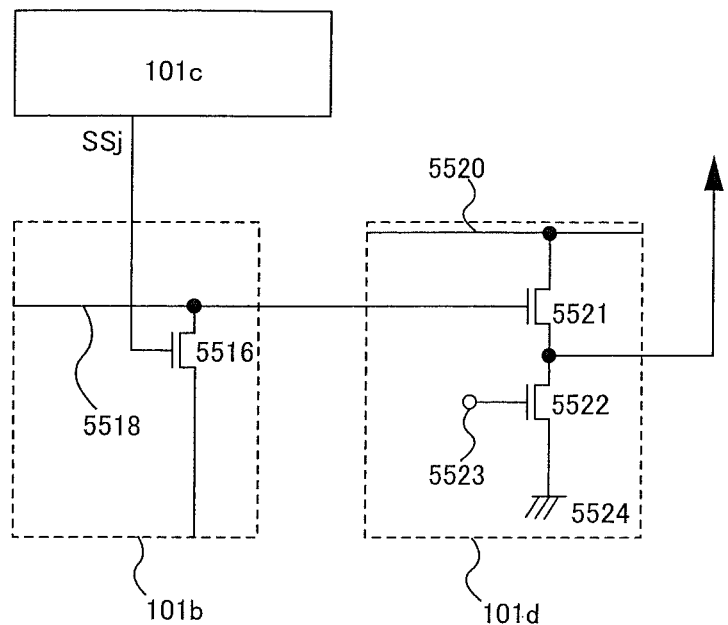
FIGS. 11A and 11B are views for explaining source signal line driving circuits of semiconductor devices to which the invention is applied.
Figure 11:
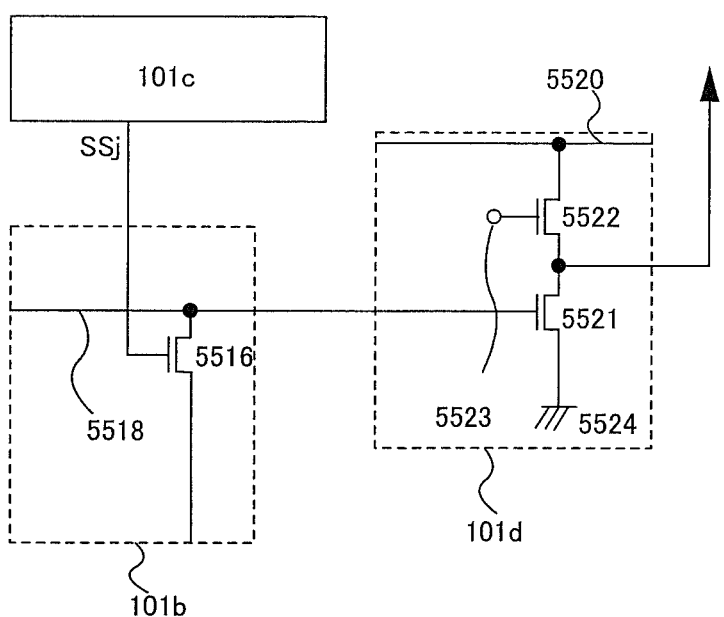

FIG. 11A shows the final amplifying circuit 101d including an n-channel source follower circuit. The input of a signal to the final output amplifying circuit 101d is performed through a final selecting transistor 5516. A final selection line (SSj) connected to a gate electrode of the final selecting transistor 5516 is provided in a matrix form in a sample hold circuit 101b, and is successively selected from the first column to the x-th column.

A signal outputted from a final output line 5518 is amplified by the final output amplifying circuit 101d and is outputted to the outside. The final output line 5518 is connected to a gate electrode of an amplifying transistor 5521. A drain region of the amplifying transistor 5521 is connected to a power supply line 5520, and a source region is an output terminal.

On the other hand, a gate electrode of a biasing transistor 5522 is connected to a final output amplifying bias signal line 5523. One of a source region and a drain region of the biasing transistor 5522 is connected to a power supply reference line 5524, and the other is connected to the source region of the amplifying transistor 5521.

Next, FIG. 11B shows the final amplifying circuit 101d including a p-channel source follower circuit. A final output line 5518 is connected to a gate electrode of an amplifying transistor 5521. A drain region of the amplifying transistor 5521 is connected to a power supply reference line 5524, and a source region becomes an output terminal.

On the other hand, a gate electrode of the biasing transistor 5522 is connected to a final output amplifying bias signal line 5523. One of a source region and a drain region of the biasing transistor 5522 is connected to a power supply line 5520, and the other is connected to the source region of the amplifying transistor 5521. Incidentally, the potential of the final output amplifying bias signal line 5523 of the p-channel source follower circuit shown in FIG. 11B is different from the potential of the final output amplifying bias signal line 523 of the n-channel source follower circuit shown in FIG. 11A.

This example can be freely combined with the embodiments 1 and 2, and the examples 1 to 3.

Example 5

In this example, a sectional structure of a semiconductor device of the invention in which a photoelectric transducer and plural transistors are provided in one pixel will be described with reference to FIG. 12.

Figure 12:
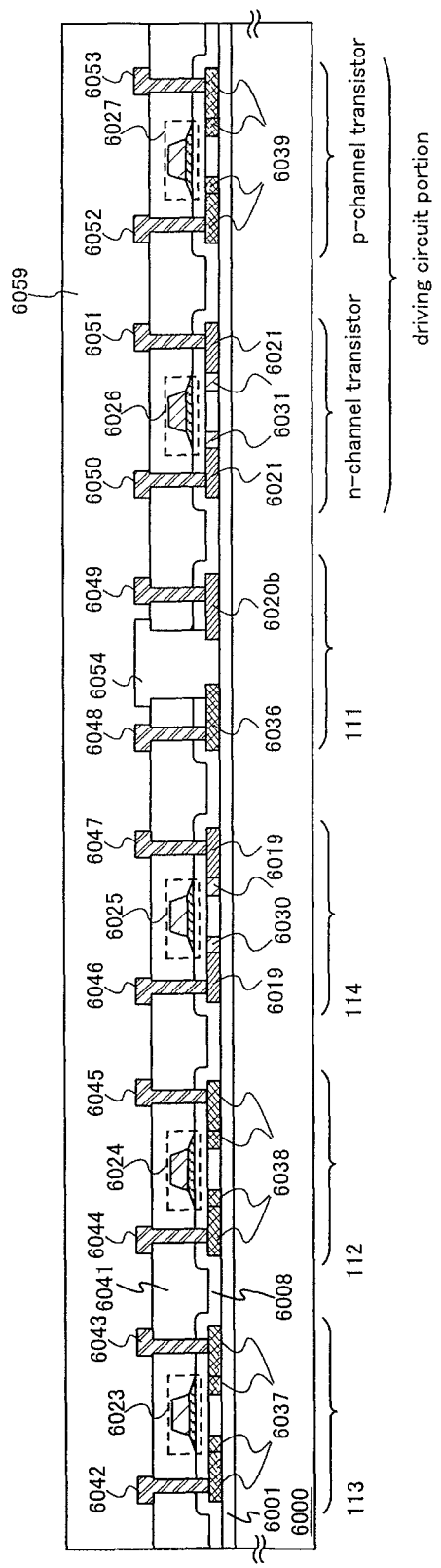
FIG. 12 is a view showing a sectional structure of a semiconductor device to which the invention is applied.

In FIG. 12, reference numeral 6000 designates a substrate having an insulating surface; and 6001, an under film. A photoelectric transducer 111, an amplifying transistor 113, a switching transistor 112, and a resetting transistor 114 are formed on the under film 6001. An n-channel transistor and a p-channel transistor are illustrated as a driving circuit portion. Incidentally, a transistor of any well-known structure may be used for each transistor.

A structure of each transistor formed on the substrate 6000 having the insulating surface will be described. The amplifying transistor 113 includes a gate electrode 6023, a gate insulating film 6008, a source region and a drain region 6037 made of p-type impurity regions, a source wiring line 6042, and a drain wiring line 6043.

The switching transistor 112 includes a gate electrode 6024, the gate insulating film 6008, a source region and a drain region 6038 made of p-type impurity regions, a source wiring line 6044, and a drain wiring line 6045.

The resetting transistor 114 includes a gate electrode 6025, the gate insulating film 6008, a source region and a drain region 6019 made of n-type impurity regions, an LDD region (Lightly Doped Drain region) 6030, a source wiring line 6046, and a drain wiring line 6047.

The photoelectric transducer 111 includes a p-type semiconductor layer 6036 made of a p-type impurity region, an n-type semiconductor layer 6020b made of an n-type impurity region, and a photoelectric conversion layer (i layer) 6054 made of an amorphous semiconductor film.

The n-channel transistor of the driving circuit portion includes a gate electrode 6026, the gate insulating film 6008, a source region and a drain region 6021 made of n-type impurity regions, an LDD (Lightly Doped Drain region) 6031, a source wiring line 6050, and a drain wiring line 6051.

Besides, the p-channel transistor of the driving circuit portion includes a gate electrode 6027, the gate insulating film 6008, a source region and a drain region 6039 made of p-type impurity regions, a drain wiring line 6052, and a source wiring line 6053.

Then, a first interlayer insulating film 6041 and a second interlay insulating film 6059 are provided to cover the amplifying transistor 113, the switching transistor 112, the resetting transistor 114, the n-channel transistor, and the p-channel transistor.

This example can be freely combined with the embodiments 1 and 2, and the examples 1 to 4.

Example 6

In this example, a description will be given of the outer appearance in a state where a semiconductor device to which the driving method of the invention is applied is sealed and an FPC is attached.

Figure 13A:
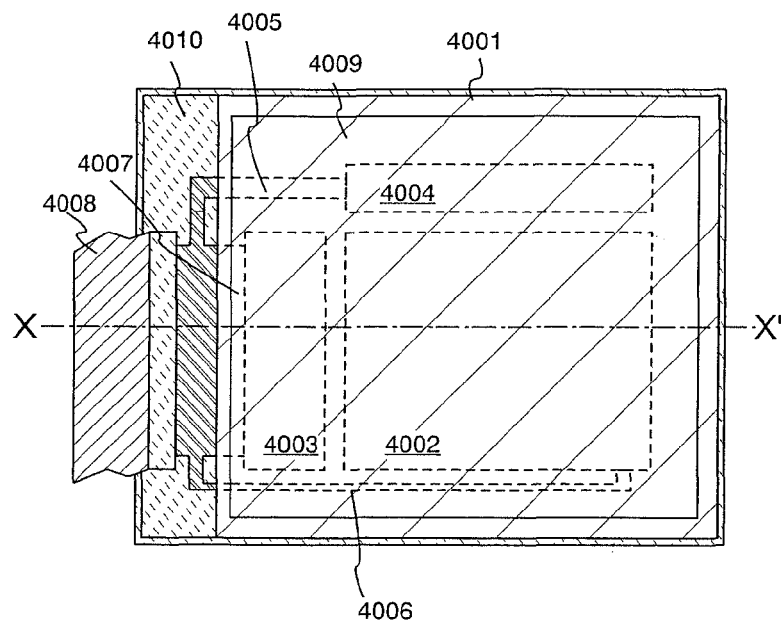
FIGS. 13A and 13B are a top view and a sectional view of a semiconductor device to which the invention is applied.
Figure 13B:
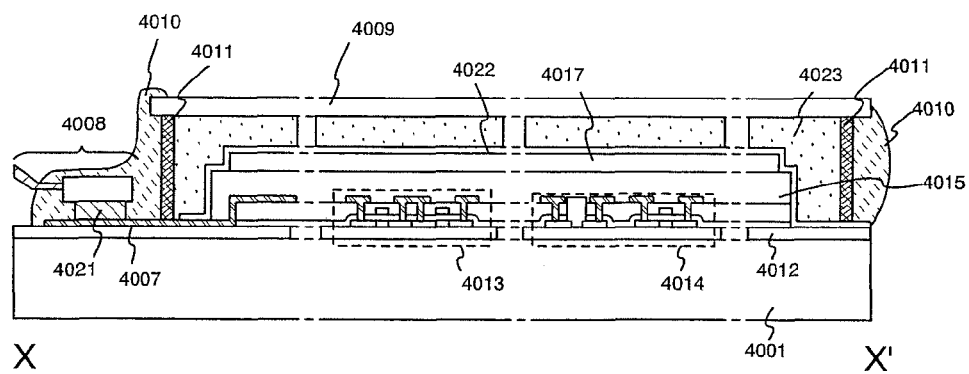

FIG. 13A is a top view of a semiconductor device, and FIG. 13B is a sectional view taken along plane X-X' of FIG. 13A. In FIG. 13A, reference numeral 4001 designates a substrate; 4002, a pixel portion; 4003, a source signal line driving circuit; and 4004, a gate signal line driving circuit. The respective driving circuits are connected to an FPC 4008 through wiring lines 4005, 4006 and 4007 and are connected to an external equipment.

At this time, a cover member 4009, a sealant 4010, and a sealing member 4011 (shown in FIG. 13B) are provided so as to surround at least the pixel portion, preferably the driving circuits and the pixel portion.

In FIG. 13B, a driving circuit portion 4013 (here, a CMOS circuit in which an n-channel TFT and a p-channel TFT are combined is shown) and a pixel portion 4014 (here, only a photoelectric transducer and a switching transistor are shown) are formed on the substrate 4001 and an under film 4012.

After the driving circuit portion 4013 and the pixel portion 4014 are completed by using a well-known fabrication method, a first interlayer insulating film (flattening film) 4015 made of a resin material is formed.

Next, a second interlayer insulating film 4017 made of a resin material is formed, and a passivation film 4022, a filler 4023, and a cover member 4009 are formed so as to cover the second interlayer insulating film 4017.

Further, the sealing member 4011 is provided inside the cover member 4009 and the substrate 4001, and next, the sealant 4010 is formed outside the sealing member 4011.

At this time, the filler 4023 functions also as an adhesive for bonding the cover member 4009. As the filler 4023, PVC (Polyvinyl Chloride), epoxy resin, silicone resin, PVB (Polyvinyl Butyral) or EVA (Ethylene Vinyl Acetate) can be used. It is preferable to provide a drying agent in the inside of the filler 4023, since a moisture absorption effect can be kept.

Besides, a spacer may be contained in the filler 4023. At this time, the spacer is made a granular material made of BaO or the like, and the spacer itself may be made to have hygroscopicity. In the case where the spacer is provided, the passivation film 4022 can relieve a spacer pressure. Besides, in addition to the passivation film 4022, a resin film to relieve the spacer pressure may be provided.

Besides, as the cover member 4009, a glass plate, an aluminum plate, a stainless plate, an FRP (Fiberglass-Reinforced Plastics) plate, a PVF (Poly-Vinyl Fluoride) film, a Mylar film, a polyester film, or an acrylic film can be used. Incidentally, in the case where PVB or EVA is used for the filler 4023, it is preferable to use a sheet having such a structure that an aluminum foil of several tens μm is sandwiched between PVF films or Mylar films.

The wiring line 4007 is connected to the transistor included in the driving circuit 4013, and is also electrically connected to the FPC 4008 through a gap between the sealing member 4011, the sealant 4010 and the substrate 4001. Incidentally, although the wiring line 4007 has been explained here, the other wiring lines 4005 and 4006 are also electrically connected to the FPC 4008 through a space under the sealing member 4011 and the sealant 4010 in the same way.

Incidentally, in this example, after the filler 4023 is provided, the cover member 4009 is bonded, and the sealing member 4011 is attached so as to cover the side (exposed surface) of the filler 4023. However, after the cover member 4009 and the sealing member 4011 are attached, the filler 4023 may be provided. In this case, an inlet of the filler 4023 leading to a gap formed by the substrate 4001, the cover member 4009 and the sealing member 4011 is provided. The gap is made to have a vacuum state, and after the inlet is immersed in a water tank containing fillers, the air pressure outside the gap is made higher than the air pressure in the gap to fill the gap with the fillers.

This example can be freely combined with the embodiments 1 and 2, and the examples 1 to 5.

Example 7

In this example, an electronic equipment using a semiconductor device to which the invention is applied will be described with reference to FIGS. 14A to 14F.

Figure 14A:
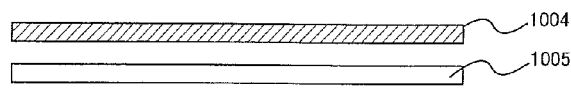
FIGS. 14A to 14G are views showing electronic equipments using semiconductor devices to which the invention is applied.

FIG. 14A shows a hand scanner using a line sensor. An optical system 1002 such as a rod lens array is provided on a CCD type (CMOS type) image sensor 1001. The optical system 1002 is used so that an image on an object 1004 is projected on the image sensor 1001. A light source 1003 such as an LED or a fluorescent lamp is provided at a position where it can irradiate the object 1004 with light. A glass 1005 is provided under the object 1004.

Light emitted from the light source 1003 is incident on the object 1004 through the glass 1005. The light reflected by the object 1004 is incident on the optical system 1002 through the glass 1005. The light incident on the optical system 1002 is incident on the image sensor 1001, and is subjected to photoelectric conversion there. The semiconductor device to which the invention is applied can be used for the image sensor 1001.

Figure 14B:
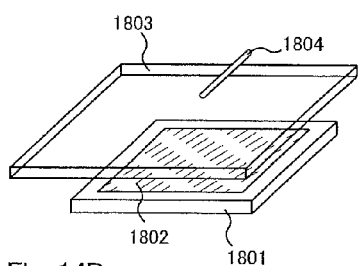

In FIG. 14B, reference numeral 1801 designates a substrate; 1802, a pixel portion; 1803, a touch panel; and 1804, a touch pen. The touch panel 1803 has transparency and can transmit light emitted from the pixel portion 1802 and incident light to the pixel portion 1802, and an image on an object can be read through the touch panel 1803. Also in the case where an image is displayed on the pixel portion 1802, the image on the pixel portion 1802 can be seen through the touch panel 1803.

When the touch pen 1804 touches the touch panel 1803, information of a position of a portion where the touch pen 1804 is in contact with the touch panel 1803 can be captured as an electric signal to a semiconductor device. With respect to the touch panel 1803 and the touch pen 1804 used in this example, well-known ones can be used as long as the touch panel 1803 is translucent, and the information of the position of the portion where the touch pen 1804 is in contact with the touch panel 1803 can be captured as an electric signal into the semiconductor device. The semiconductor device to which the invention is applied can be used for the pixel portion 1801.

Figure 14C:
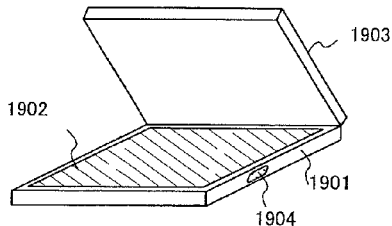
Figure 14D:
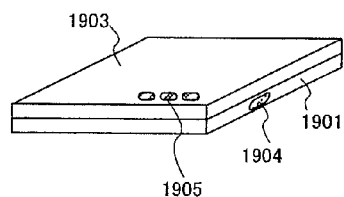

FIG. 14C shows a portable hand scanner different from that of FIG. 14A, and is constituted by a main body 1901, a pixel portion 1902, an upper cover 1903, an external connection port 1904, and an operation switch 1905. FIG. 14D is a view in which the upper cover 1903 of the same portable hand scanner as that of FIG. 14C is closed.

It is also possible to send an image signal read in the pixel portion 1902 to an electronic equipment connected to the outside of the portable hand scanner from the external connection port 1904, and to perform correction, composition, and edit of an image in a personal computer. The semiconductor device to which the invention is applied can be used for the pixel portion 1902.

Besides, the electronic equipment using the semiconductor device to which the invention is applied, includes a video camera, a digital still camera, a notebook personal computer, a portable information terminal (mobile computer, portable telephone, portable game machine, electronic book, etc.) and the like.

Figure 14E:
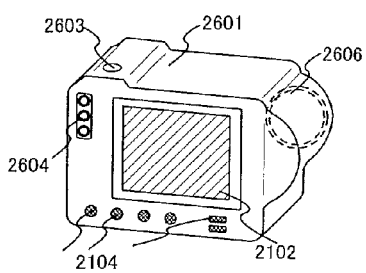

FIG. 14E shows a digital video camera which includes a main body 2601, a display portion 2602, a chassis 2603, an external connection port 2604, a remote control reception portion 2605, an image receiving portion 2606, a battery 2607, a voice input portion 2608, an operation key 2609, and the like. The semiconductor device to which the invention is applied can be used for the display portion 2102.

Figure 14F:
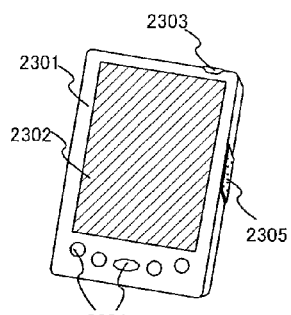

FIG. 14F shows a mobile computer which includes a main body 2301, a display portion 2302, a switch 2303, an operation key 2304, an infrared port 2305, and the like. The semiconductor device to which the invention is applied can be used for the display portion 2302.

Figure 14G:
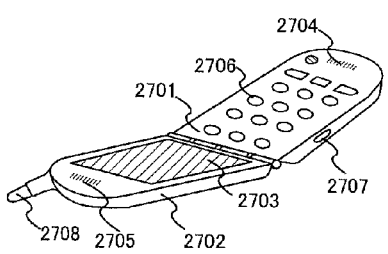
Figure 15:
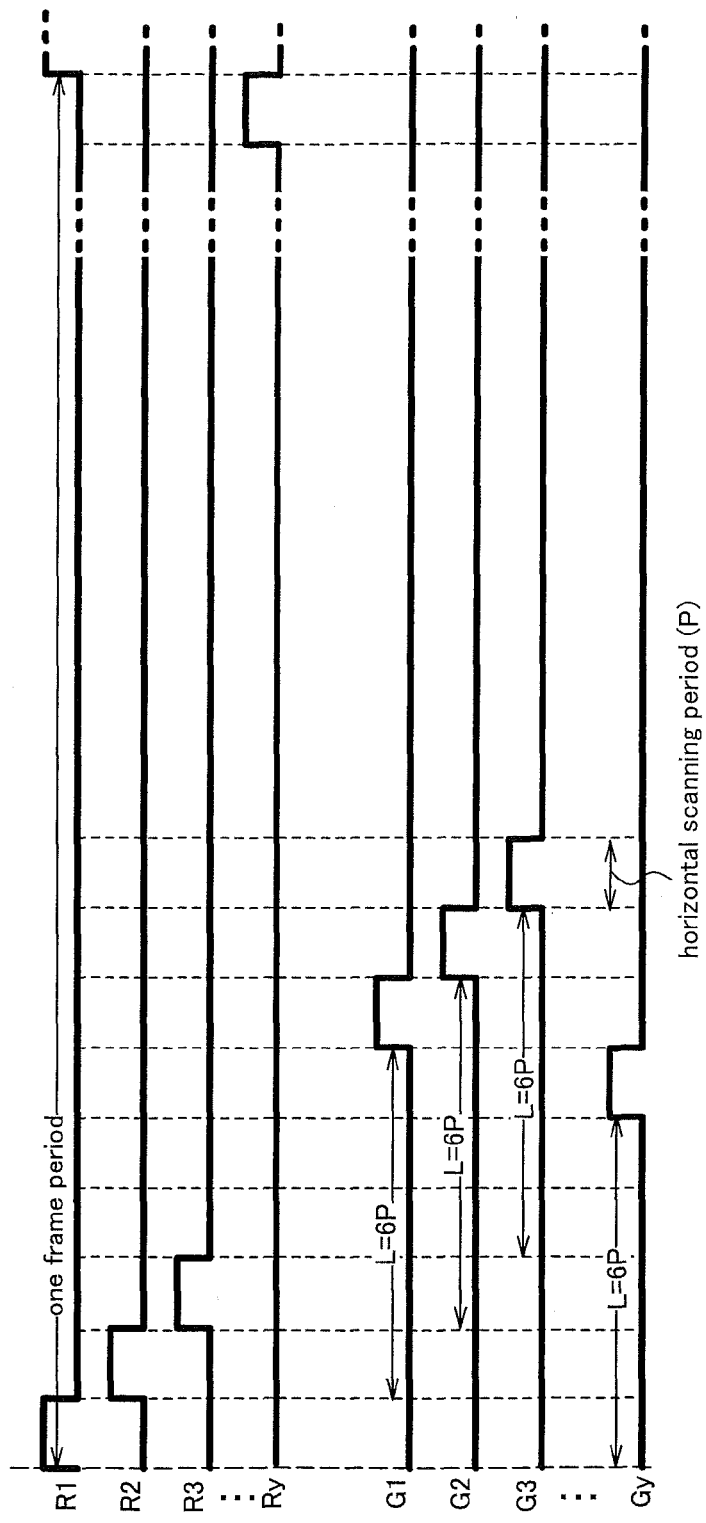
FIG. 15 is a view for explaining an operation of a conventional semiconductor device.
Figure 16:
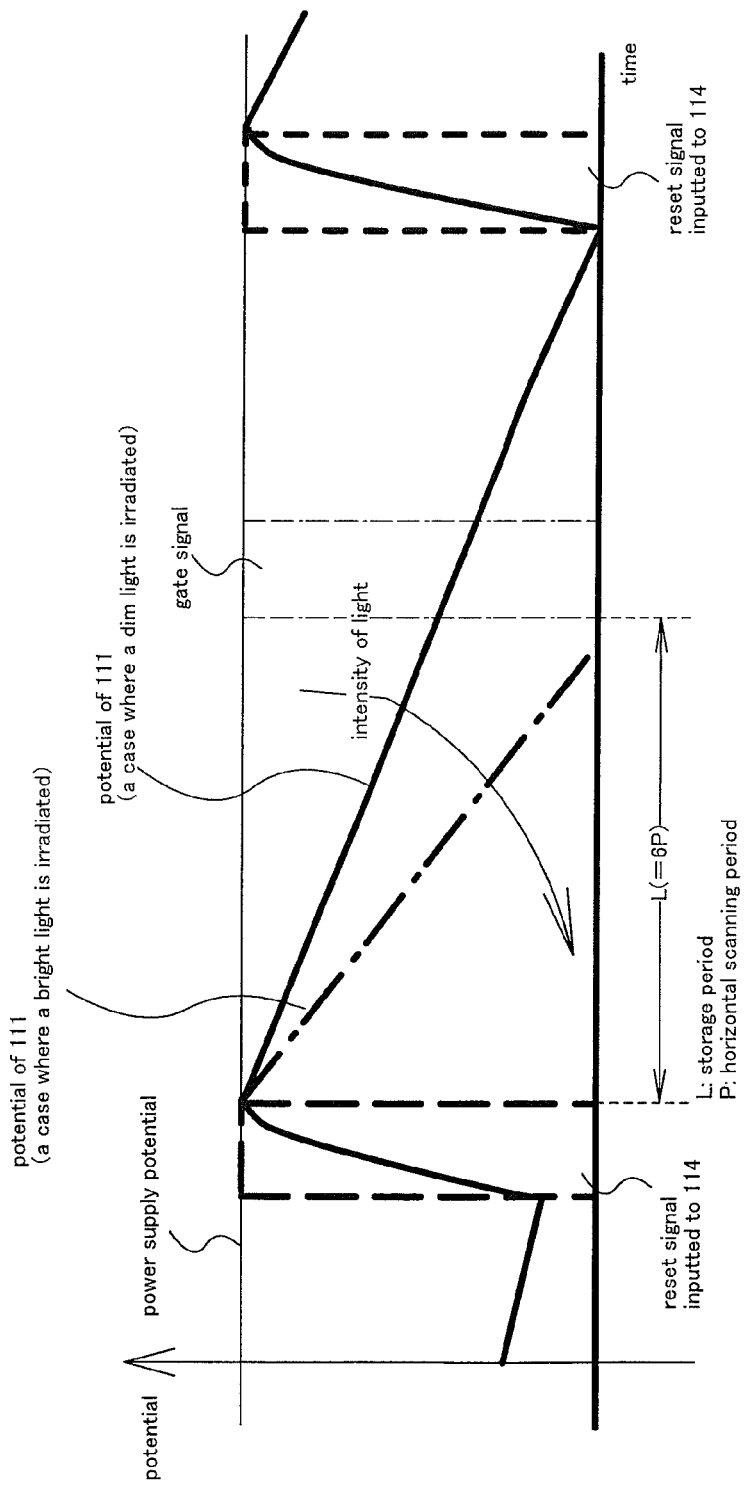
FIG. 16 is a view for explaining the relation between the potential of a photoelectric transducer and the time.
Figure 17:
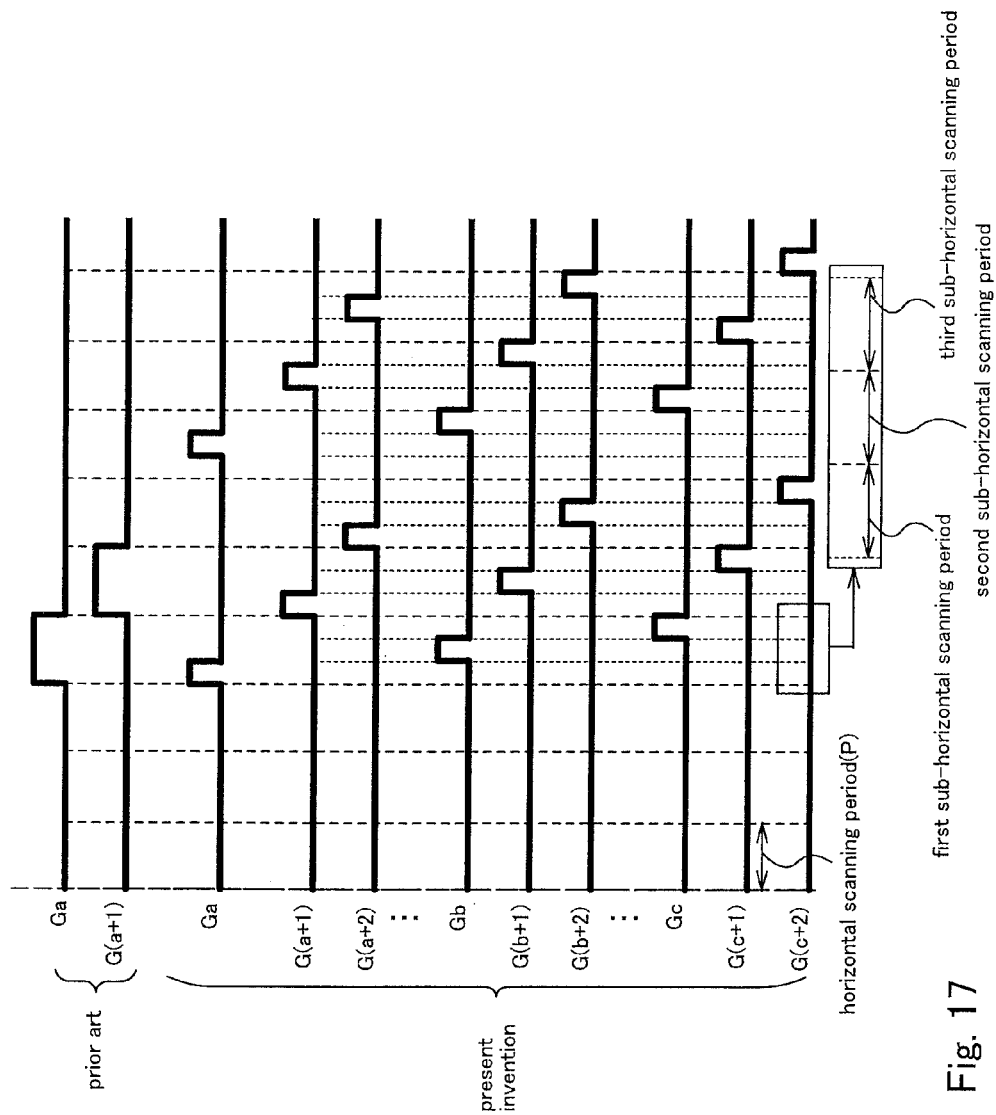
FIG. 17 is a view for explaining an operation of a semiconductor device of the invention.

FIG. 14G shows a portable telephone which includes a main body 2701, a chassis 2702, a display portion 2703, a voice input portion 2704, a voice output portion 2705, an operation key 2706, an external connection portion 2707, an antenna 2708, and the like. The semiconductor device to which the invention is applied can be used for the display portion 2703.

As described above, the invention has a very wide range of application and can be used for electronic equipments of any fields.

According to the driving method of the semiconductor device of the invention, a horizontal scanning period (P) is divided into n parts (n is a natural number), so that horizontal scanning can be performed (n×y) times in one frame period. According to the invention, n signals can be outputted from each pixel, and storage times of the n signals are different from one another. Thus, since a signal suited to the intensity of light irradiated to a pixel can be selected, information of an object can be accurately read. Besides, the dynamic range of the read object can be expanded.

What is claimed is:

1. A semiconductor device comprising:
   a substrate;
   a cover member;
   a sealing member;
   a sealant outside the sealing member;
   a driving circuit over the substrate;
   a first transistor over the substrate;
   a second transistor over the substrate;
   a third transistor over the substrate; and
   a pixel portion inside the sealing member and surrounded by the substrate, the cover member and the sealing member, the pixel portion comprising a first pixel,
   wherein a first output terminal of the driving circuit is operatively connected to one of a source and a drain of the first transistor,
   wherein the first output terminal of the driving circuit is operatively connected to one of a source and a drain of the second transistor,
   wherein the first output terminal of the driving circuit is operatively connected to one of a source and a drain of the third transistor,
   wherein the one of the source and the drain of the first transistor is directly connected to the one of the source and the drain of the second transistor,
   wherein the one of the source and the drain of the first transistor is directly connected to the one of the source and the drain of the third transistor, and
   wherein the other of the source and the drain of the first transistor is electrically connected to the first pixel.

2. The semiconductor device according to claim 1,
   wherein the other of the source and the drain of the second transistor is electrically connected to the first pixel, and
   wherein the other of the source and the drain of the third transistor is electrically connected to the first pixel.

3. The semiconductor device according to claim 1, wherein the first pixel comprises a diode.

4. The semiconductor device according to claim 3, wherein the diode is a photodiode.

5. The semiconductor device according to claim 1, further comprising:
   a fourth transistor;
   a fifth transistor;
   a sixth transistor; and
   a second pixel,
   wherein a second output terminal of the driving circuit is operatively connected to one of a source and a drain of the fourth transistor,
   wherein the second output terminal of the driving circuit is operatively connected to one of a source and a drain of the fifth transistor, wherein the second output terminal of the driving circuit is operatively connected to one of a source and a drain of the sixth transistor, wherein the other of the source and the drain of the fourth transistor is electrically connected to the second pixel, wherein a gate of the first transistor is electrically connected to a gate of the fourth transistor, wherein a gate of the second transistor is electrically connected to a gate of the fifth transistor, and wherein a gate of the third transistor is electrically connected to a gate of the sixth transistor.

6. The semiconductor device according to claim 1, wherein a source signal line driving circuit comprises the driving circuit, the first transistor, the second transistor and the third transistor.

7. The semiconductor device according to claim 6, wherein the source signal line driving circuit is surrounded by the substrate, the cover member and the sealing member.

8. The semiconductor device according to claim 1,
wherein the first output terminal of the driving circuit is electrically connected to a gate of a final outputting transistor and one of a source and a drain of the final outputting transistor is electrically connected to the one of the source and the drain of the first transistor, so that the first output terminal of the driving circuit is operatively connected to the one of the source and the drain of the first transistor, wherein the first output terminal of the driving circuit is electrically connected to the gate of the final outputting transistor and the one of the source and the drain of the final outputting transistor is electrically connected to the one of the source and the drain of the second transistor, so that the first output terminal of the driving circuit is operatively connected to the one of the source and the drain of the second transistor, and wherein the first output terminal of the driving circuit is electrically connected to the gate of the final outputting transistor and the one of the source and the drain of the final outputting transistor is electrically connected to the one of the source and the drain of the third transistor, so that the first output terminal of the driving circuit is operatively connected to the one of the source and the drain of the third transistor.

9. A semiconductor device comprising:
a substrate;
a cover member;
a sealing member;
a sealant outside the sealing member;
a first transistor over the substrate;
a second transistor over the substrate;
a third transistor over the substrate; and
a pixel portion inside the sealing member and surrounded by the substrate, the cover member and the sealing member, the pixel portion comprising a first pixel, wherein one of a source and a drain of the first transistor is directly connected to one of a source and a drain of the second transistor, wherein the one of the source and the drain of the first transistor is directly connected to one of a source and a drain of the third transistor, and wherein the other of the source and the drain of the first transistor is electrically connected to the first pixel.

10. The semiconductor device according to claim 9,
wherein the other of the source and the drain of the second transistor is electrically connected to the first pixel, and wherein the other of the source and the drain of the third transistor is electrically connected to the first pixel.

11. The semiconductor device according to claim 9, wherein the first pixel comprises a diode.

12. The semiconductor device according to claim 11, wherein the diode is a photodiode.

13. The semiconductor device according to claim 9, further comprising:
a fourth transistor;
a fifth transistor;
a sixth transistor; and
a second pixel,
wherein one of a source and a drain of the fourth transistor is electrically connected to one of a source and a drain of the fifth transistor, wherein the one of the source and the drain of the fourth transistor is electrically connected to one of a source and a drain of the sixth transistor, wherein the other of the source and the drain of the fourth transistor is electrically connected to the second pixel, wherein a gate of the first transistor is electrically connected to a gate of the fourth transistor, wherein a gate of the second transistor is electrically connected to a gate of the fifth transistor, and wherein a gate of the third transistor is electrically connected to a gate of the sixth transistor.

14. The semiconductor device according to claim 9, wherein a source signal line driving circuit comprises the first transistor, the second transistor and the third transistor.

15. The semiconductor device according to claim 14, wherein the source signal line driving circuit is surrounded by the substrate, the cover member and the sealing member.

* * * * *